(12) United States Patent
Nishiwaki

(10) Patent No.: US 12,087,736 B2
(45) Date of Patent: Sep. 10, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Tatsuya Nishiwaki, Komatsu (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 133 days.

(21) Appl. No.: 17/470,540

(22) Filed: Sep. 9, 2021

(65) Prior Publication Data

US 2022/0302084 A1 Sep. 22, 2022

(30) Foreign Application Priority Data

Mar. 17, 2021 (JP) .................. 2021-043577

(51) Int. Cl.
*H01L 25/065* (2023.01)
*H01L 23/00* (2006.01)
*H01L 25/00* (2006.01)

(52) U.S. Cl.
CPC .......... *H01L 25/0657* (2013.01); *H01L 24/20* (2013.01); *H01L 24/19* (2013.01);
(Continued)

(58) Field of Classification Search
CPC ..... H10B 80/00; H01L 25/0657; H01L 24/19; H01L 24/20; H01L 25/50; H01L 224/351; H01L 2924/3512; H01L 2224/211
(Continued)

(56) References Cited

U.S. PATENT DOCUMENTS 8,686,569 B2 4/2014 Daeche et al.
10,121,737 B2 11/2018 Gottwald et al.
(Continued)

FOREIGN PATENT DOCUMENTS

JP 2003-273319 A 9/2003
JP 2015-15350 A 1/2015
(Continued)

OTHER PUBLICATIONS

Schweizer, M. et al., "Heatsink-less Quasi 3-level Flying Capacitor Inverter Based on Low Voltage SMD MOSFETs," EPE'17 ECCE Europe, 2017, pp. 1-10.

*Primary Examiner* — Jasmine J Clark
(74) *Attorney, Agent, or Firm* — Maier & Maier, PLLC

(57) ABSTRACT

A semiconductor device includes semiconductor elements, an insulating member, first and second terminals and control terminals. The semiconductor elements each include a semiconductor part, a first electrode on the back surface of the semiconductor part, a second electrode and a control electrode on the front surface thereof. The semiconductor elements are electrically connected in series and include first-end and second-end semiconductor elements each provided at an end of the series connection. The insulating member seals the semiconductor elements and includes a first surface and a second surface opposite to the first surface. The first and second terminals are electrically connected to the first electrode of the first-end semiconductor element and the second electrode of the second-end semiconductor element, respectively. Each control terminal is electrically connected to the control electrode. The second and control terminals are provided at one of the first or second surface side of the insulating member.

15 Claims, 20 Drawing Sheets

(52) U.S. Cl.
CPC ......... *H01L 25/50* (2013.01); *H01L 2224/211* (2013.01); *H01L 2924/3512* (2013.01)

(58) Field of Classification Search
USPC ................................................ 257/347, 777
See application file for complete search history.

(56) References Cited

U.S. PATENT DOCUMENTS

| | | |
|---|---|---|
| 2009/0018291 A1 | 1/2009 | Kwak et al. |
| 2011/0266683 A1* | 11/2011 | Feng .................... H01L 23/481 |
| | | 257/773 |
| 2014/0063744 A1 | 3/2014 | Lopez et al. |
| 2015/0008534 A1 | 1/2015 | Nagase et al. |
| 2019/0259690 A1 | 8/2019 | Kawashima |

FOREIGN PATENT DOCUMENTS

| | | |
|---|---|---|
| JP | 2015-530748 A | 10/2015 |
| JP | 2019-145776 A | 8/2019 |
| JP | 2020-92176 A | 6/2020 |

* cited by examiner

SEMICONDUCTOR DEVICE

CROSS-REFERENCE TO RELATED APPLICATIONS

This application is based upon and claims the benefit of priority from Japanese Patent Application No. 2021-043577, filed on Mar. 17, 2021; the entire contents of which are incorporated herein by reference.

FIELD

Embodiments relate to a semiconductor device.

BACKGROUND

A semiconductor device having high breakdown voltage can be achieved by connecting multiple semiconductor elements in series. When the multiple semiconductor elements are arranged in a plane, however, the semiconductor device may occupy a large mounting area on a circuit board.

DETAILED DESCRIPTION

Figure 1:
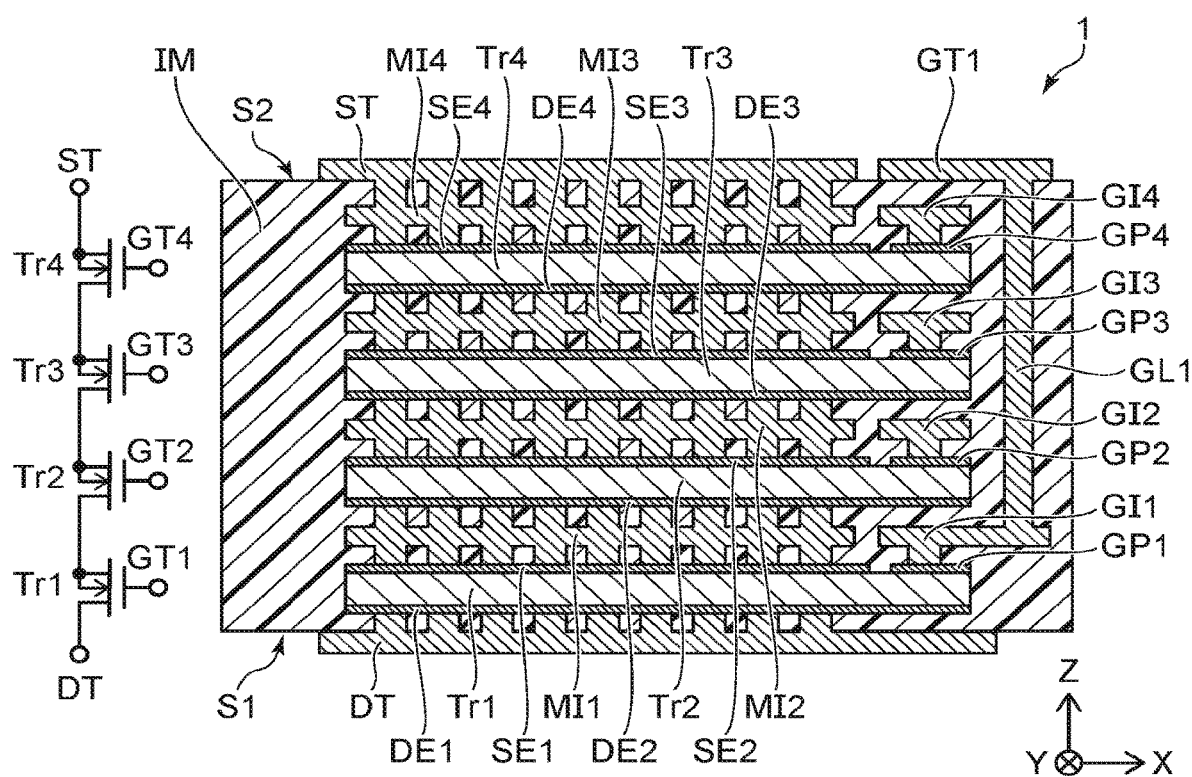
FIG. 1 is a schematic cross-sectional view showing a semiconductor device according to a first embodiment.

According to an embodiment, a semiconductor device includes a plurality of semiconductor elements, an insulating member, first and second terminals and a plurality of control terminals. The plurality of semiconductor elements each include a semiconductor part, first and second electrodes, and a control electrode. The semiconductor part has a front surface and a back surface opposite to the front surface, the first electrode being provided on the back surface of the semiconductor part, the second electrode being provided on the front surface of the semiconductor part, the control electrode being provided on the front surface of the semiconductor part. The control electrode controls a current that flows between the first electrode and the second electrode. The plurality of semiconductor elements are arranged in a first direction directed from the first electrode toward the second electrode. The plurality of semiconductor elements is connected in series. The plurality of semiconductor elements include a first semiconductor element, a second semiconductor element, a first-end semiconductor element and a second-end semiconductor element. The second semiconductor element is provided next to the first semiconductor element. The first electrode of the second semiconductor element is electrically connected to the second electrode of the first semiconductor element. The first-end semiconductor element is provided at one end of the series connection. The second-end semiconductor element is provided at another end of the series connection. The insulating member seals the plurality of semiconductor elements. The insulating member includes a first surface and a second surface opposite to the first surface, the first and second surfaces crossing the first direction. The first surface faces the first-end semiconductor element. The second surface faces the second-end semiconductor element. The first terminal is electrically connected to the first electrode of the first-end semiconductor element. The second terminal is provided at one of the first surface side or the second surface side of the insulating member. The second terminal is electrically connected to the second electrode of the second-end semiconductor element. The plurality of control terminals are electrically connected to the control electrodes of the plurality of semiconductor elements, respectively. The plurality of control terminals are provided at the one of the first surface side or the second surface side of the insulating member. The plurality of control terminals are apart from each other and apart from the second terminal.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a semiconductor device 1 according to a first embodiment.

Figure 2A:
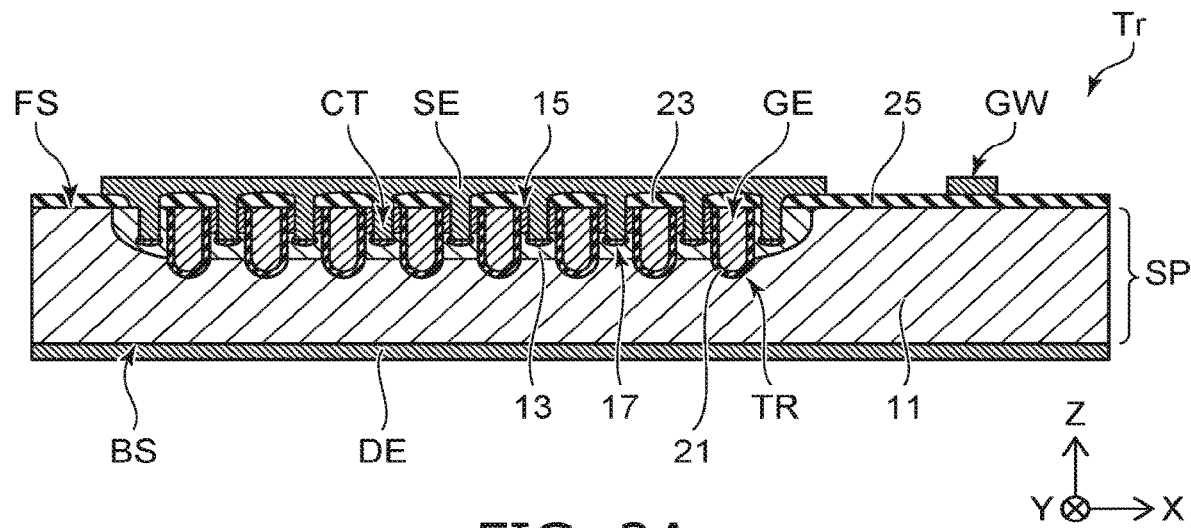
FIGS. 2A and 2B are schematic views showing a semiconductor element according to the first embodiment.
Figure 2B:
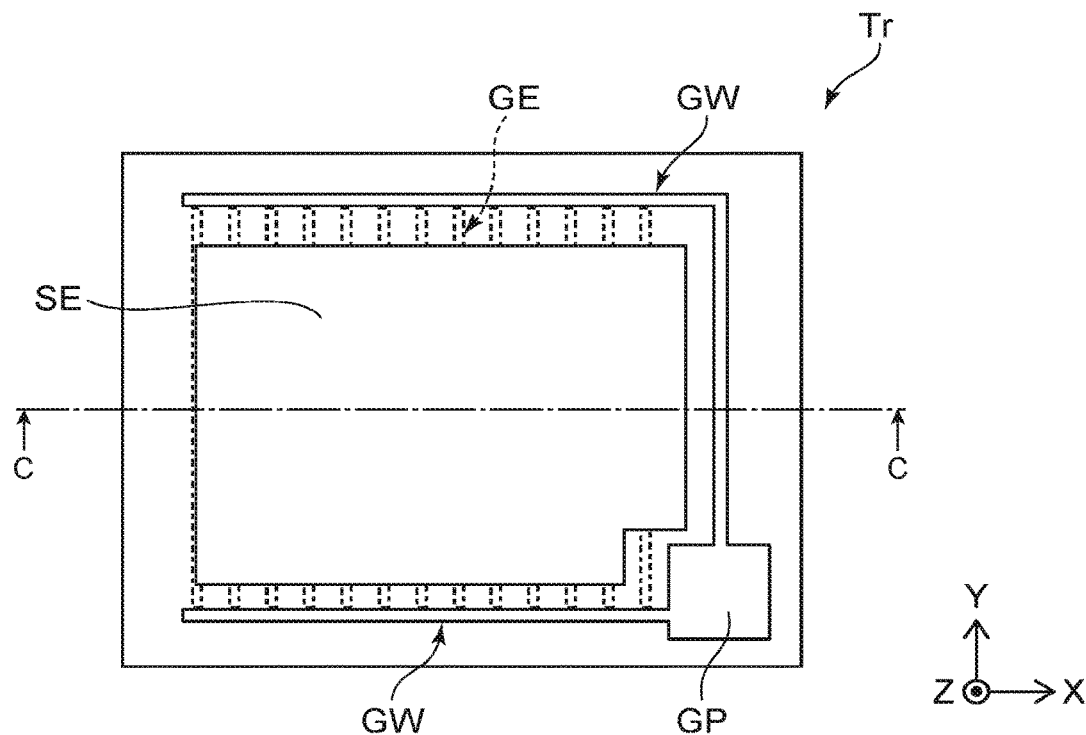

FIGS. 2A and 2B are schematic views showing a semiconductor element Tr according to the first embodiment.

As shown in FIG. 1, the semiconductor device 1 includes multiple semiconductor elements Tr1 to Tr4, an insulating member IM, a first terminal DT, a second terminal ST, and a control terminal GT1. The semiconductor elements Tr are, for example, MOS transistors. Hereinbelow, the semiconductor elements Tr1 to Tr4 each may be described as the semiconductor element Tr.

As shown in FIGS. 2A and 2B, the semiconductor element Tr includes a semiconductor part SP, a first electrode DE, a second electrode SE, a control electrode GE, a control interconnect GW, and a control pad GP.

The semiconductor part SP is, for example, silicon. The semiconductor part SP includes, for example, a back surface BS and a front surface FS. The first electrode DE is, for example, a drain electrode and is provided on the back surface BS of the semiconductor part SP. The second electrode SE is, for example, a source electrode and is provided on the front surface FS of the semiconductor part SP. The first electrode DE and the second electrode SE are, for example, metal layers that include copper.

The semiconductor part SP includes a trench TR that is provided at the front surface FS side. The control electrode GE is provided, for example, inside the trench TR. The control electrode GE is, for example, a gate electrode. The control electrode GE controls a current that flows between the first electrode DE and the second electrode SE. The control electrode GE is, for example, conductive polysilicon. The control electrode GE is provided between the semiconductor part SP and the second electrode SE. The control electrode GE is electrically insulated from the semiconductor part SP by, for example, a gate insulating film 21. Also, the control electrode GE is electrically insulated from the second electrode SE by, for example, an inter-layer insulating film 23.

The semiconductor part SP includes, for example, a first semiconductor layer 11 of a first conductivity type, a second semiconductor layer 13 of a second conductivity type, a third semiconductor layer 15 of the first conductivity type, and a fourth semiconductor layer 17 of the second conductivity type. For example, the first conductivity type is an n-type; and the second conductivity type is a p-type.

The first semiconductor layer 11 is, for example, an n-type drift layer. The first semiconductor layer 11 extends between the first electrode DE and the second electrode SE. The trench TR has, for example, a depth enough to extend from the front surface FS of the semiconductor part SP into the first semiconductor layer 11. For example, the control electrode GE faces the first semiconductor layer 11 via the gate insulating film 21.

The second semiconductor layer 13 is, for example, a p-type diffusion layer. The second semiconductor layer 13 is provided between the first semiconductor layer 11 and the second electrode SE. Multiple control electrodes GE are provided in the semiconductor part SP; and the second semiconductor layer 13 is provided between adjacent control electrodes GE. For example, the second semiconductor layer 13 faces the control electrode GE via the gate insulating film 21.

The third semiconductor layer 15 is, for example, an n-type source layer. The third semiconductor layer 15 is provided between the second semiconductor layer 13 and the second electrode SE. The second semiconductor layer 13 is electrically connected to the second electrode SE.

The fourth semiconductor layer 17 is, for example, a p-type contact layer. For example, the fourth semiconductor layer 17 is provided between the second semiconductor layer 13 and the second electrode SE. The fourth semiconductor layer 17 includes a second-conductivity-type impurity with a higher concentration than the concentration of the second-conductivity-type impurity in the second semiconductor layer 13.

The semiconductor part SP includes a contact trench CT that is provided between the adjacent control electrodes GE; and the second electrode SE includes a portion that extends inside the contact trench CT. The second electrode SE is electrically connected to the third and fourth semiconductor layers 15 and 17 that are exposed inside the contact trench CT. The second semiconductor layer 13 is electrically connected to the second electrode SE via the fourth semiconductor layer 17.

The control interconnect GW and the control pad GP are provided on the front surface FS of the semiconductor part SP. For example, the control interconnect GW and the control pad GP are electrically insulated from the semiconductor part SP by a passivation film 25 that covers the front surface FS of the semiconductor part SP. The control interconnect GW and the control pad GP are apart from the second electrode SE. The control interconnect GW and the control pad GP are, for example, metal layers that include copper.

As shown in FIG. 2B, the control interconnect GW is electrically connected to the control electrode GE. The control interconnect GW is connected to the control pad GP; and the control pad GP is electrically connected to the control electrode GE via the control interconnect GW.

As shown in FIG. 1, for example, the multiple semiconductor elements Tr1 to Tr4 are arranged in a first direction (a Z-direction) that is directed from the first electrode DE toward the second electrode SE. In the multiple semiconductor elements Tr1 to Tr4, the adjacent semiconductor elements Tr are electrically connected such that an second electrode SE of one of the adjacent semiconductor elements Tr is electrically connected to a first electrode DE of the other of the adjacent semiconductor elements Tr. That is, the multiple semiconductor elements Tr1 to Tr4 are connected in series.

For example, a second electrode SE1 of the semiconductor element Tr1 is electrically connected to a first electrode DE2 of the semiconductor element Tr2 via an intermediate interconnect MI1.

For example, a second electrode SE2 of the semiconductor element Tr2 is electrically connected to a first electrode DE3 of the semiconductor element Tr3 via an intermediate interconnect MI2.

For example, a second electrode SE3 of the semiconductor element Tr3 is electrically connected to a first electrode DE4 of the semiconductor element Tr4 via an intermediate interconnect MI3.

Figure 3A:
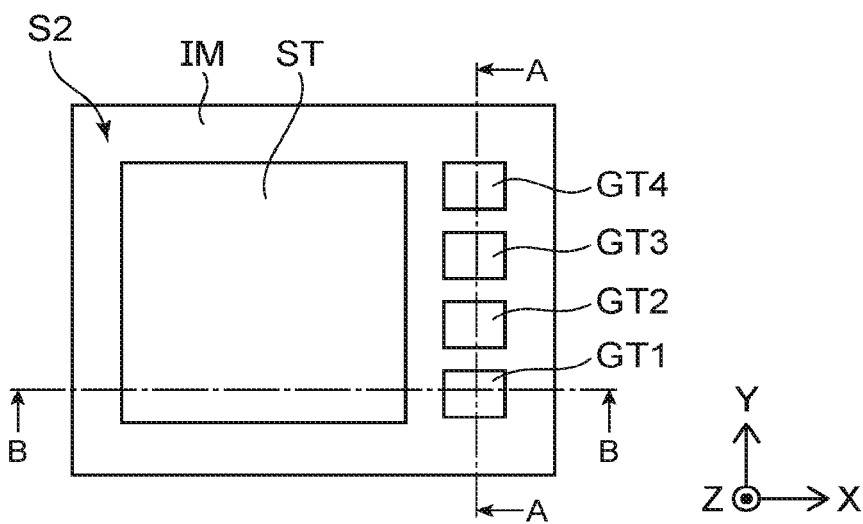
FIGS. 3A to 3C are schematic views showing the semiconductor device according to the first embodiment.
Figure 3B:
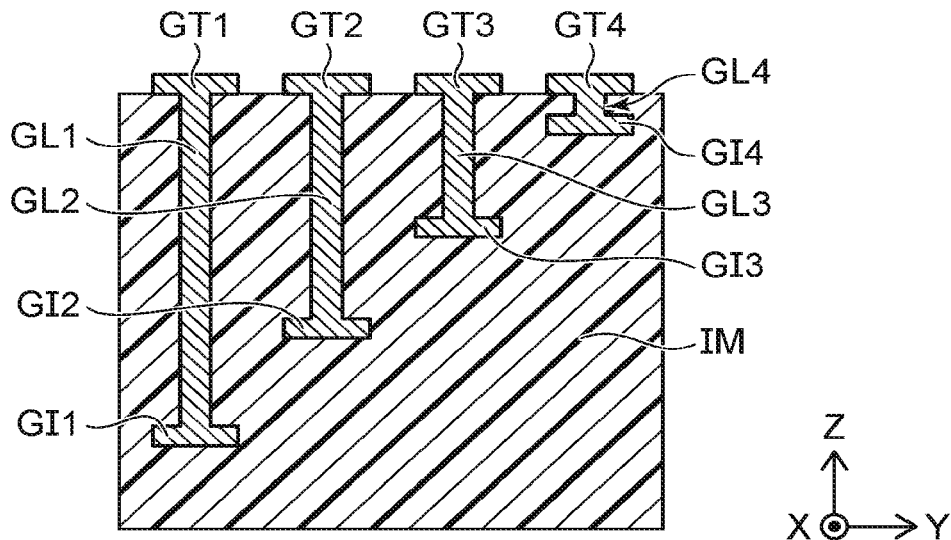
Figure 3C:
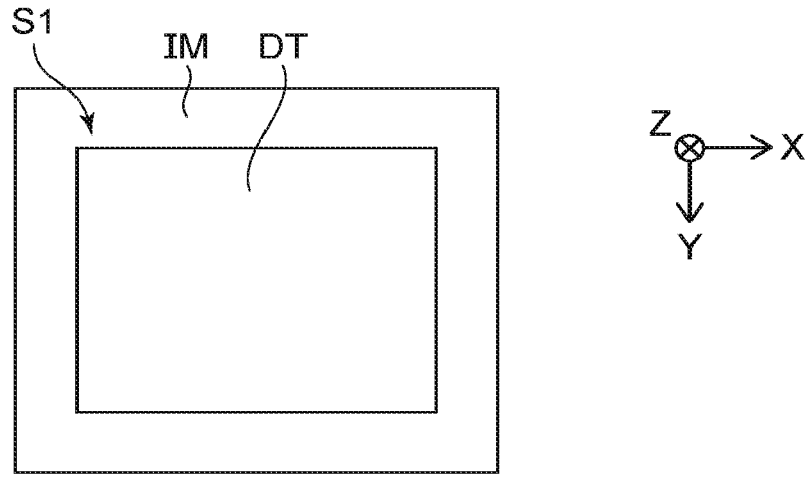

The semiconductor device 1 further includes control terminals GT2 to GT4 and control interconnects GI1 to GI4 (referring to FIGS. 3A to 3C).

The semiconductor element Tr1 is provided at one end of the series connection of the semiconductor elements Tr1 to Tr4. A first electrode DE1 of the semiconductor element Tr1 is electrically connected to the first terminal DT. The first terminal DT is, for example, the drain terminal of the semiconductor device 1.

The semiconductor element Tr4 is provided at the other end of the series connection of the semiconductor elements Tr1 to Tr4. For example, a second electrode SE4 of the semiconductor element Tr4 is electrically connected to the second terminal ST via an intermediate interconnect MI4. The second terminal ST is, for example, the source terminal of the semiconductor device 1.

The semiconductor elements Tr1 to Tr4 are sealed in, for example, the insulating member IM. The insulating member IM includes, for example, an epoxy resin. The insulating member IM includes, for example, a first surface S1 and a second surface S2 that cross the Z-direction. The first surface S1 is positioned at the side opposite to the second surface S2. The first terminal DT is provided, for example, on the first surface S1. The second terminal ST and the control terminal GT1 are apart from each other, for example, on the second surface S2.

The multiple control interconnects GI1 to GI4 are provided in the insulating member IM. The control interconnects GI1 to GI4 are electrically connected respectively to control pads GP1 to GP4 of the semiconductor elements Tr1 to Tr4.

The control interconnect GI1 is electrically connected to the control pad GP1 of the semiconductor element Tr1. Also, the control interconnect GI1 is electrically connected to the control terminal GT1 via a contact plug GL1.

FIGS. 3A to 3C are schematic views showing the semiconductor device 1 according to the first embodiment.

FIG. 3A is a schematic plan view showing the second surface S2 of the insulating member IM.

FIG. 3B is a cross-sectional view along line A-A shown in FIG. 3A. FIG. 1 is a cross-sectional view along line B-B shown in FIG. 3A.

FIG. 3C is a schematic plan view showing the first surface S1 of the insulating member IM.

As shown in FIG. 3A, the second terminal ST and the multiple control terminals GT1 to GT4 are provided on the second surface S2 of the insulating member IM. The second terminal ST is apart from the multiple control terminals GT1 to GT4. The multiple control terminals GT1 to GT4 are apart from each other.

As shown in FIG. 3B, the control terminal GT1 is electrically connected to the control interconnect GI1 via the contact plug GL1. The control terminal GT2 is electrically connected to a control interconnect GI2 via a contact plug GL2. The control terminal GT3 is electrically connected to a control interconnect GI3 via a contact plug GL3. The control terminal GT4 is electrically connected to the control interconnect GI4 via a contact plug GL4.

As shown in FIG. 3C, the first terminal DT is provided on the first surface S1 of the insulating member IM.

Figure 4A:
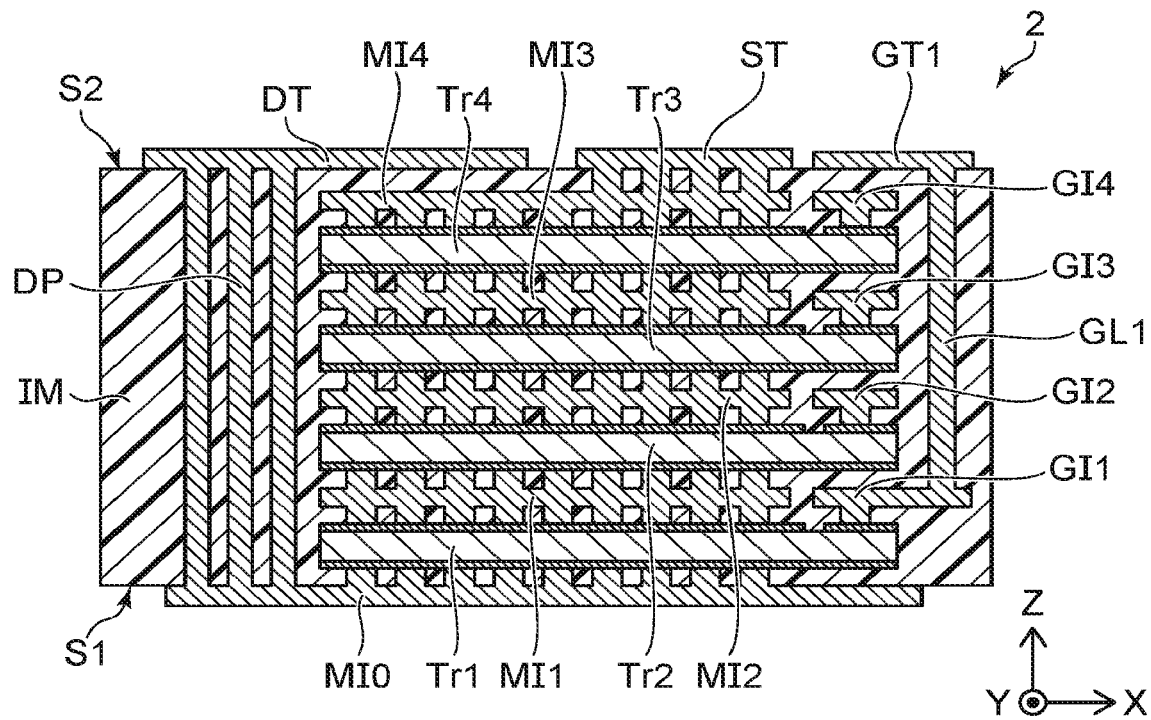
FIGS. 4A and 4B are schematic views showing a semiconductor device according to a first modification of the first embodiment.
Figure 4B:
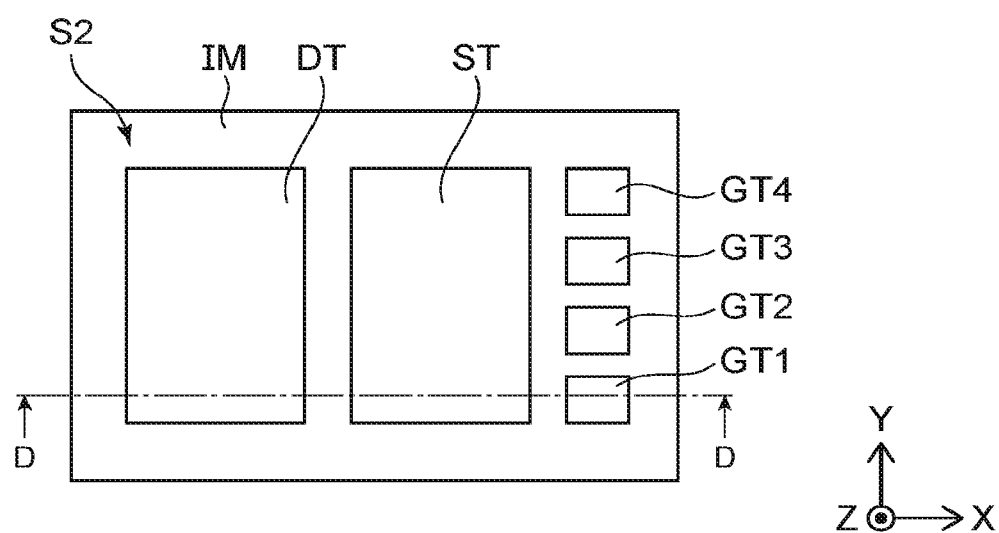

FIGS. 4A and 4B are schematic views showing a semiconductor device 2 according to a first modification of the first embodiment. FIG. 4A is a cross-sectional view showing the structure of the semiconductor device 2. FIG. 4B is a schematic view showing the second surface S2 of the insulating member IM.

As shown in FIG. 4A, the semiconductor device 2 includes the multiple semiconductor elements Tr1 to Tr4 that are arranged in the Z-direction. The semiconductor elements Tr1 to Tr4 are sealed in the insulating member IM and connected in series via the intermediate interconnects MI1 to MI3.

The semiconductor device 2 further includes an intermediate interconnect MI0. The intermediate interconnect MI0 is provided on the first surface S1 of the insulating member IM. The semiconductor element Tr1 is provided at one end of the series connection of the semiconductor elements Tr1 to Tr4. The semiconductor element Tr1 is electrically connected to the intermediate interconnect MI0.

As shown in FIG. 4B, the first terminal DT, the second terminal ST, and the multiple control terminals GT1 to GT4 are provided on the second surface S2 of the insulating member IM.

The first terminal DT is electrically connected to the intermediate interconnect MI0 via a contact plug DP that extends in the insulating member IM (referring to FIG. 4A). The first terminal DT is electrically connected to the semiconductor element Tr1 via the contact plug DP and the intermediate interconnect MI0.

The second terminal ST is electrically connected to the semiconductor element Tr4 via the intermediate interconnect MI4. The semiconductor element Tr4 is provided at the other end of the series connection of the multiple semiconductor elements Tr1 to Tr4.

The multiple control terminals GT1 to GT4 are electrically connected respectively to the control pads GP1 to GP4 of the semiconductor elements Tr1 to Tr4 via the contact plugs GL1 to GL4 and the control interconnects GI1 to GI4 (referring to FIG. 3B).

A method for manufacturing the semiconductor device 2 according to the first modification of the first embodiment will be described with reference to FIGS. 5A to 8B. FIGS. 5A to 8B are schematic cross-sectional views showing manufacturing processes of the semiconductor device 2. Also, the semiconductor device 1 is made using similar manufacturing processes.

Figure 5A:
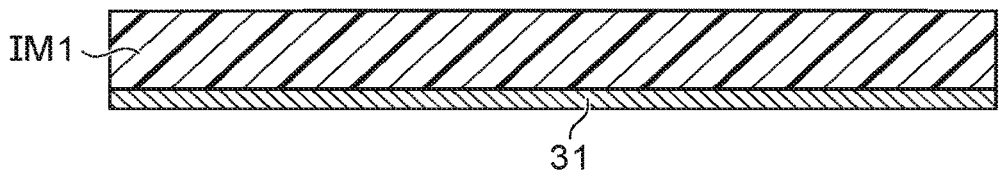
FIGS. 5A to 8B are schematic cross-sectional views showing manufacturing processes of the semiconductor device according to the first modification of the first embodiment.

A first insulating member IM1 is prepared as shown in FIG. 5A. The first insulating member IM1 includes a front surface and a back surface that cross the Z-direction. This is similar for second to fourth insulating members IM2 to IM4 and the other components.

The first insulating member IM1 includes a metal layer 31 that is provided on the back surface of the first insulating member IM1. The first insulating member IM1 is, for example, a glass epoxy substrate. The metal layer 31 is, for example, a copper foil.

Figure 5B:
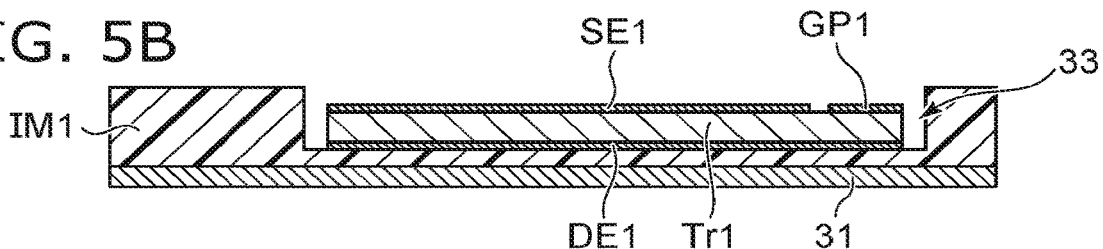

As shown in FIG. 5B, a recess 33 is formed in the first insulating member IM1; subsequently, the semiconductor element Tr1 is provided in the recess 33. For example, the recess 33 is formed using laser patterning. The recess 33 is formed to be deeper than the thickness of the semiconductor element Tr1. The semiconductor element Tr1 is provided so that the first electrode DE1 contacts the bottom surface of the recess 33.

Figure 5C:
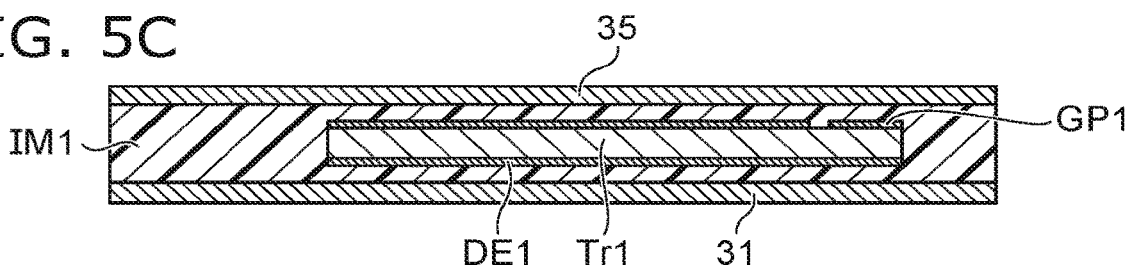

As shown in FIG. 5C, the semiconductor element Tr1 is sealed by filling the recess 33 with a resin; subsequently, the front surface of the first insulating member IM1 is planarized. The recess 33 is filled with, for example, an epoxy resin. Subsequently, a metal layer 35 is formed on the front surface of the first insulating member IM1. The metal layer 35, for example, is adhered onto the front surface of the first insulating member IM1 via an adhesive layer (not illustrated). The metal layer 35 is, for example, a copper foil.

Figure 5D:
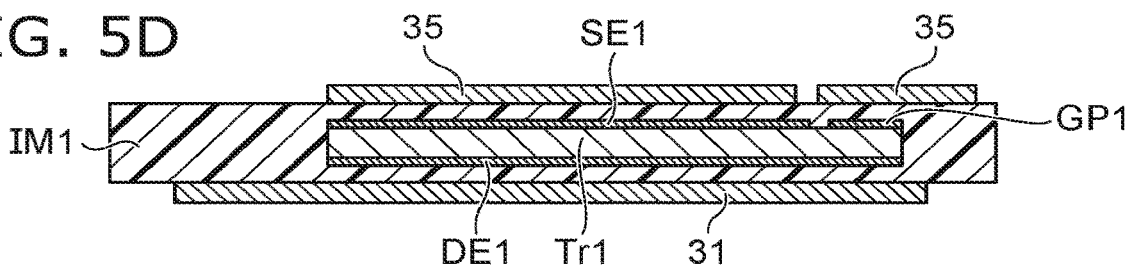

As shown in FIG. 5D, at the back surface and front surface of the first insulating member IM1, the metal layer 31 and the metal layer 35 each are patterned into a prescribed shape. The metal layer 31 is patterned to include a portion that faces the first electrode DE of the semiconductor element Tr1 via a portion of the first insulating member IM1. The metal layer 35 is patterned to include portions that face the control pad GP1 and the second electrode SE1 of the semiconductor element Tr1 via other portions of the first insulating member IM1.

Figure 5E:
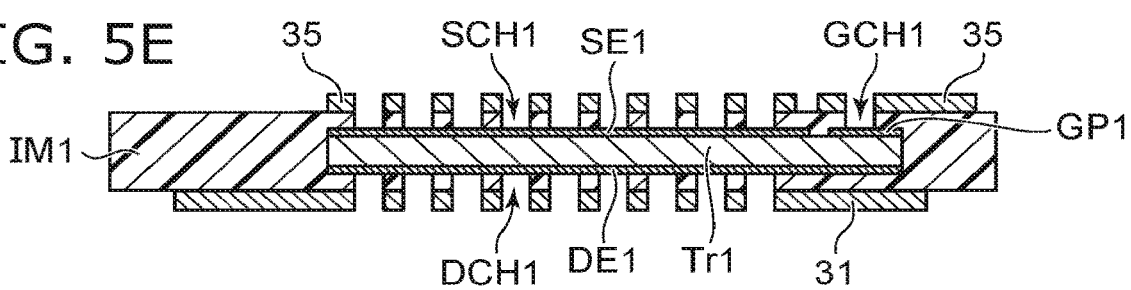

As shown in FIG. 5E, multiple contact holes DCH1 that communicate with the first electrode DE1 of the semiconductor element Tr1 are formed at the backside of the first insulating member IM1. The contact holes DCH1 are formed by selectively removing portions of the metal layer 31 and the first insulating member IM1. Also, multiple contact holes SCH1 that communicate with the second electrode SE1 of the semiconductor element Tr1 and a contact hole GCH1 that communicates with the control pad GP1 of the semiconductor element Tr1 are formed at the front side of the first insulating member IM1. The contact holes SCH1 and GCH1 are formed by selectively removing portions of the metal layer 35 and the first insulating member IM1.

Figure 5F:
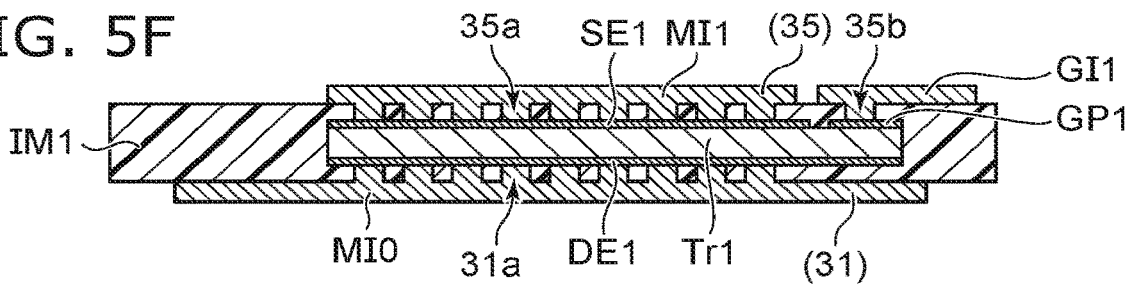

As shown in FIG. 5F, a contact metal 31a is formed to fill the contact holes DCH1 at the backside of the first insulating member IM1. The contact metal 31a is formed using, for example, copper plating. Thereby, the intermediate interconnect MI0 is formed at the backside of the first insulating member IM1. The intermediate interconnect MI0 is electrically connected to the first electrode DE1 of the semiconductor element Tr1 via the contact metal 31a.

Contact metals 35a and 35b are formed respectively to fill the contact holes SCH1 and GCH1 at the front side of the first insulating member IM1. The contact metals 35a and 35b are formed using, for example, copper plating. The intermediate interconnect MI1 and the control interconnect GI1 are formed thereby. The intermediate interconnect MI1 is electrically connected to the second electrode SE1 of the semiconductor element Tr1 via the contact metal 35a. The control interconnect GI1 is electrically connected to the control pad GP1 of the semiconductor element Tr1 via the contact metal 35b.

Figure 6A:
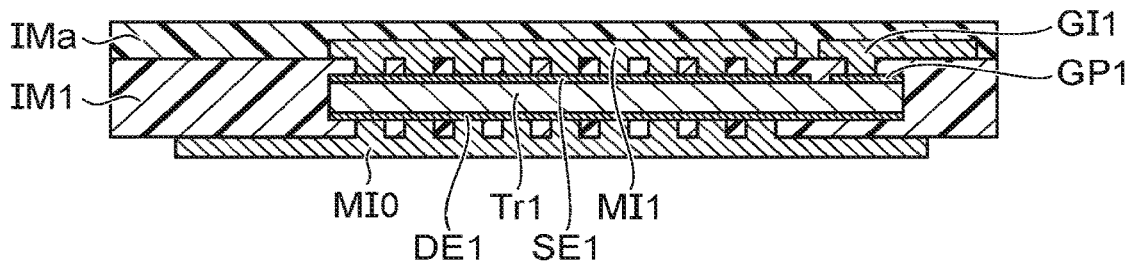

As shown in FIG. 6A, a first insulating layer IMa is formed on the front surface of the first insulating member IM1. The first insulating layer IMa is formed to cover the intermediate interconnect MI1 and the control interconnect GI1. The first insulating layer IMa is, for example, a resin layer in a half-cured state. That is, the first insulating layer IMa is so-called pre-preg. The pre-preg includes, for example, an epoxy resin and glass fibers.

Figure 6B:
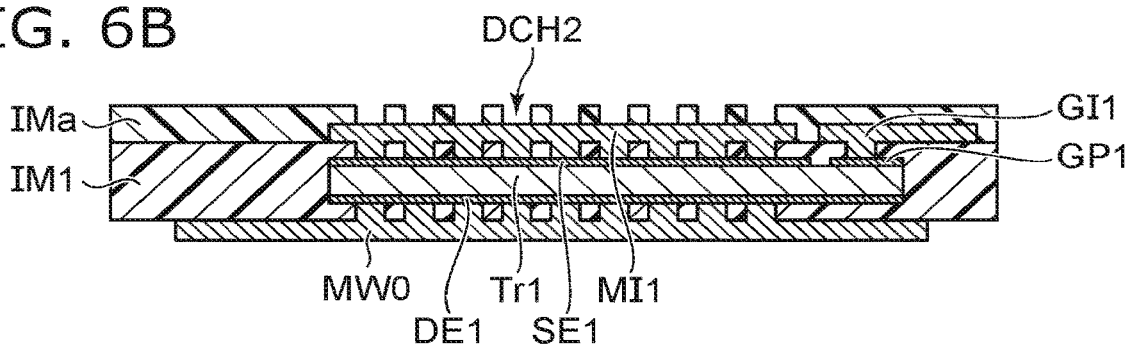

As shown in FIG. 6B, multiple contact holes DCH2 are formed in the first insulating layer IMa. The contact holes DCH2 are formed to communicate with the intermediate interconnect MI1.

Figure 6C:
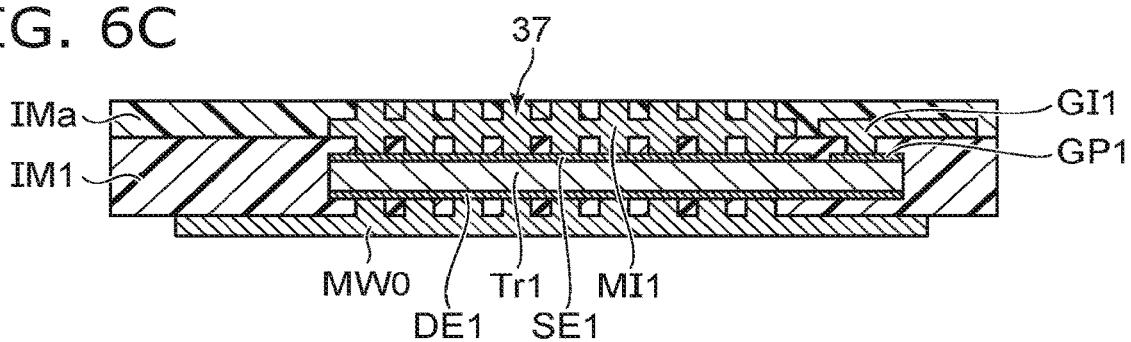

As shown in FIG. 6C, a contact metal 37 is formed to fill the contact holes DCH2. The contact metal 37 is formed using, for example, copper plating.

Figure 6D:
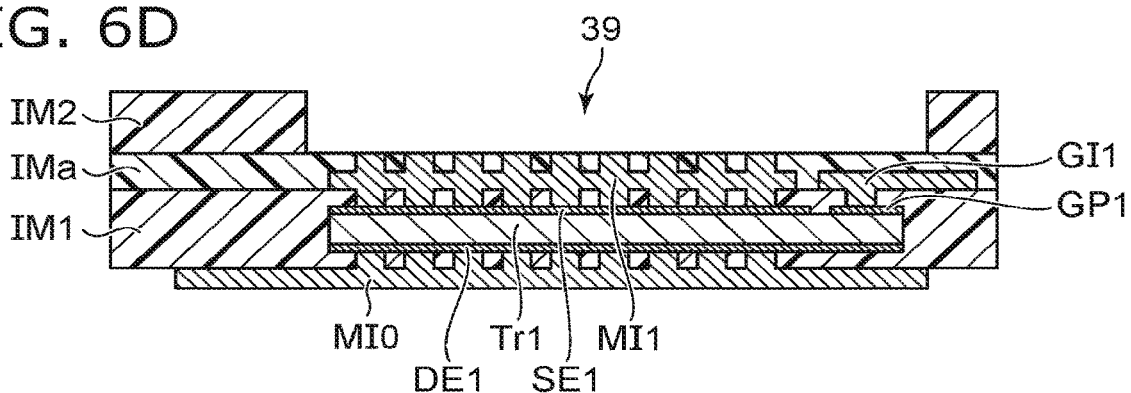

As shown in FIG. 6D, a second insulating member IM2 is formed on the first insulating layer IMa. The second insulating member IM2 is, for example, pre-preg. The second insulating member IM2 includes an opening 39. For example, the opening 39 exposes the first insulating layer IMa and the contact metal 37.

Figure 7A:
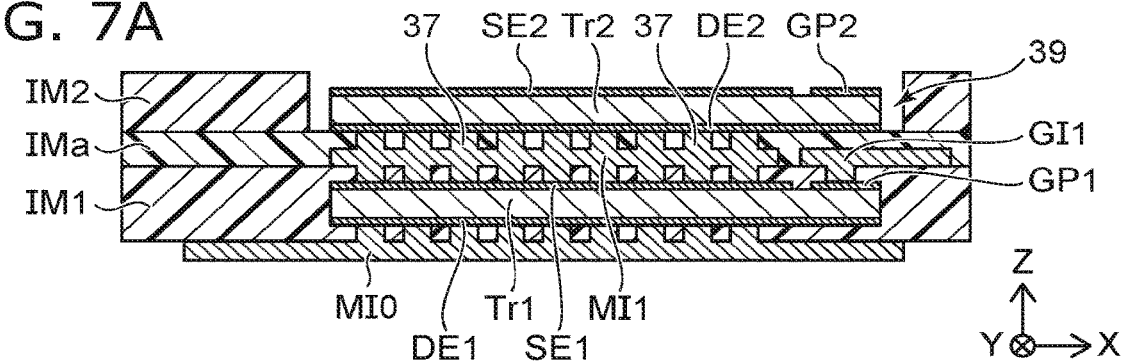

As shown in FIG. 7A, the semiconductor element Tr2 is provided in the opening 39. The semiconductor element Tr2 is fixed on the front surface of the first insulating layer IMa by, for example, a conductive adhesive. The semiconductor element Tr2 is provided so that the first electrode DE2 is electrically connected to the contact metal 37 at the bottom surface of the opening 39.

Figure 7B:
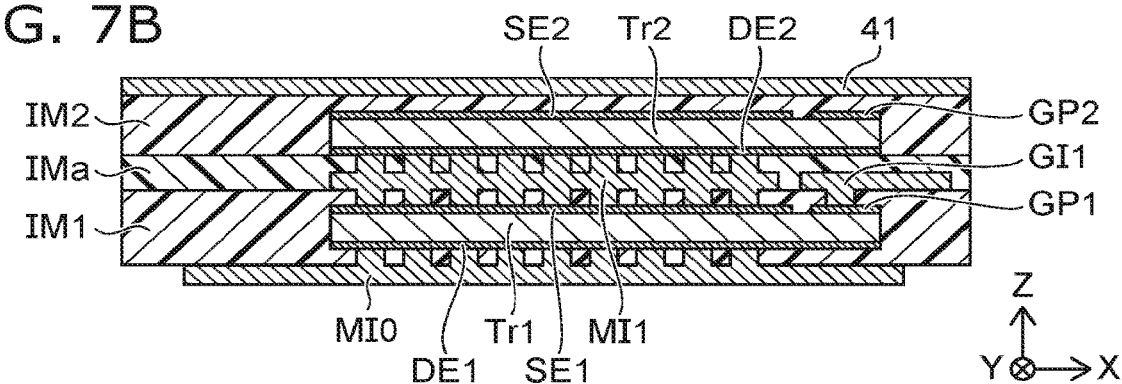

As shown in FIG. 7B, the semiconductor element Tr2 is sealed inside the opening 39. The opening 39 is filled with, for example, an epoxy resin that covers the semiconductor element Tr2. Then, the second insulating member IM2 and the resin are planarized at the front surface side thereof, and a metal layer 41 is formed on the front surface of the second insulating member IM2. The metal layer 41 is, for example, a copper foil.

Figure 7C:
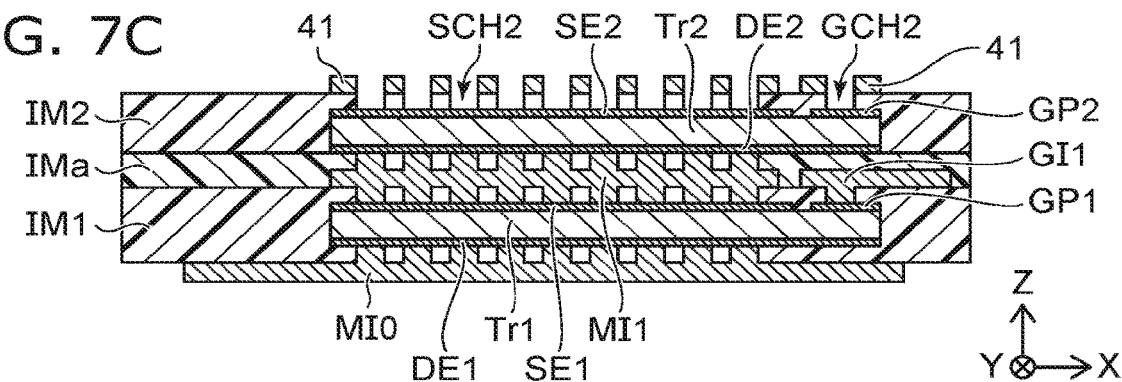

As shown in FIG. 7C, multiple contact holes SCH2 and a contact hole GCH2 are formed in the second insulating member IM2. The contact holes SCH2 are formed to communicate with the second electrode SE2 of the semiconductor element Tr2. The contact hole GCH2 is formed to communicate with the control pad GP2 of the semiconductor element Tr2. The contact holes SCH2 and GCH2 are formed by removing a portion of the metal layer 41 and a portion of the second insulating member IM2.

Figure 7D:
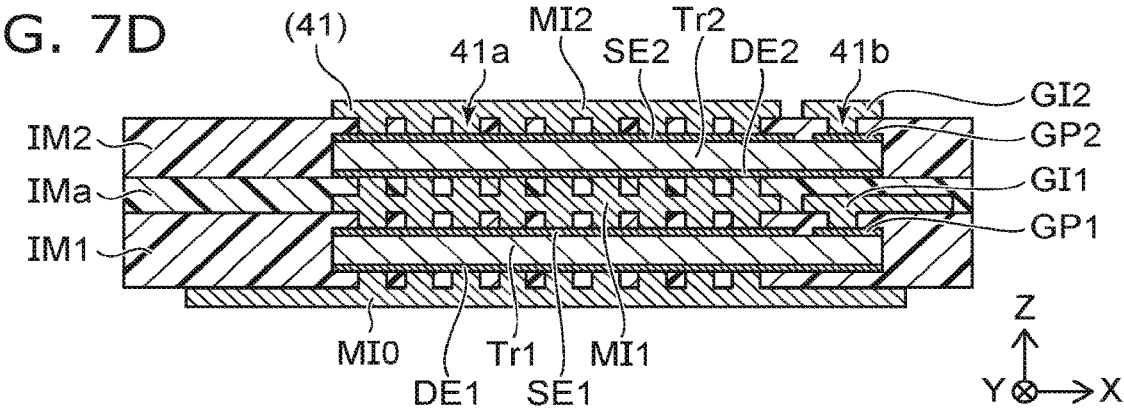

As shown in FIG. 7D, a contact metal 41a is formed to fill the contact holes SCH2. A contact metal 41b is formed to fill the contact hole GCH2. The contact metals 41a and 41b are formed using, for example, copper plating.

The contact metal 41a is formed to be linked to the metal layer 41. The intermediate interconnect MI2 includes the contact metal 41a and the metal layer 41. The intermediate interconnect MI2 is electrically connected to the second electrode SE2 of the semiconductor element Tr2 via the contact metal 41a.

The contact metal 41b is formed to be linked to other metal layer 41. The control interconnect GI2 includes the contact metal 41b and the other metal layer 41. The control interconnect GI2 is electrically connected to the control pad GP2 of the semiconductor element Tr2 via the contact metal 41b.

Subsequently, a third insulating member IM3 and a fourth insulating member IM4 are formed by repeating the manufacturing processes shown in FIGS. 6A to 7D.

Figure 8A:
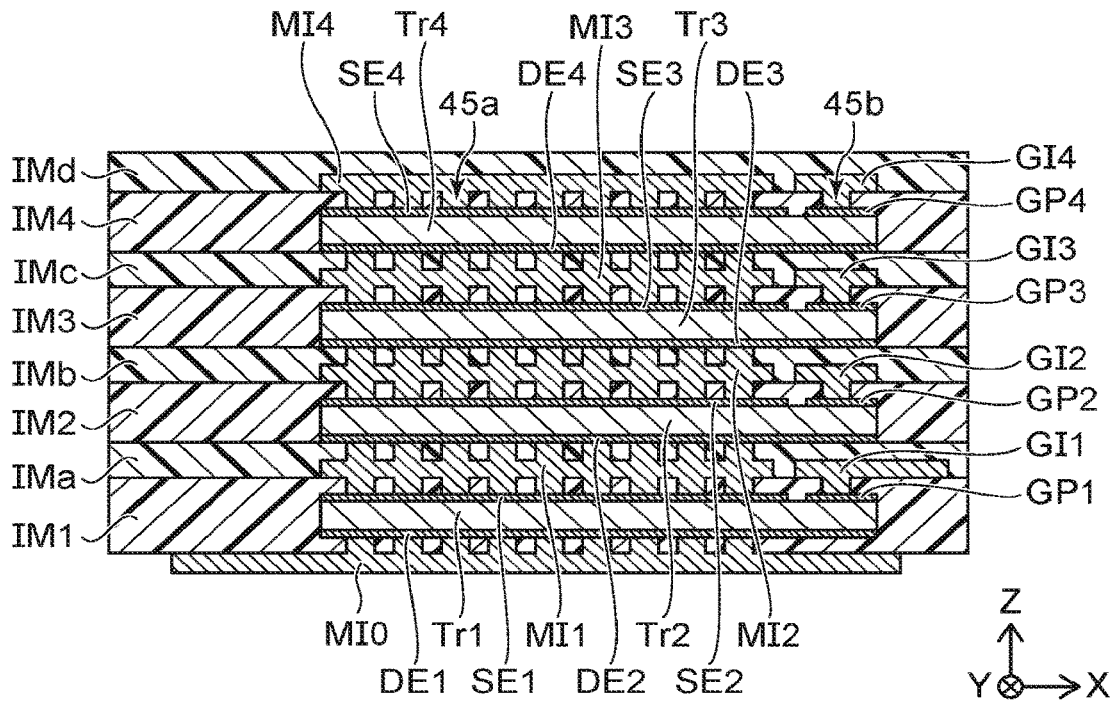

As shown in FIG. 8A, the third insulating member IM3 is provided on the second insulating member IM2. The semiconductor element Tr3 is sealed inside the third insulating member IM3. The fourth insulating member IM4 is provided on the third insulating member IM3. The semiconductor element Tr4 is sealed inside the fourth insulating member IM4.

A second insulating layer IMb is formed between the second insulating member IM2 and the third insulating member IM3. The second insulating layer IMb includes the intermediate interconnect MI2 and the control interconnect GI2. The intermediate interconnect MI2 is electrically connected to the second electrode SE2 of the semiconductor element Tr2 and the first electrode DE3 of the semiconductor element Tr3. The control interconnect GI2 is electrically connected to the control pad GP2 of the semiconductor element Tr2.

A third insulating layer IMc is formed between the third insulating member IM3 and the fourth insulating member IM4. The third insulating layer IMc includes the intermediate interconnect MI3 and the control interconnect GI3. The intermediate interconnect MI3 is electrically connected to the second electrode SE3 of the semiconductor element Tr3 and the first electrode DE4 of the semiconductor element Tr4. The control interconnect GI3 is electrically connected to the control pad GP3 of the semiconductor element Tr3.

A fourth insulating layer IMd is formed on the fourth insulating member IM4. The fourth insulating layer IMd is, for example, pre-prep. The fourth insulating layer IMd covers the intermediate interconnect MI4 and the control interconnect GI4. The intermediate interconnect MI4 is electrically connected to the second electrode SE4 of the semiconductor element Tr4 via a contact metal 45a. The control interconnect GI4 is electrically connected to the control pad GP4 of the semiconductor element Tr4 via a contact metal 45b.

The intermediate interconnects MI3 and MI4 and the control interconnects GI3 and GI4 are formed using manufacturing processes similar to those of the intermediate interconnect MI2 and the control interconnect GI2 (referring to FIGS. 7A to 7D).

Figure 8B:
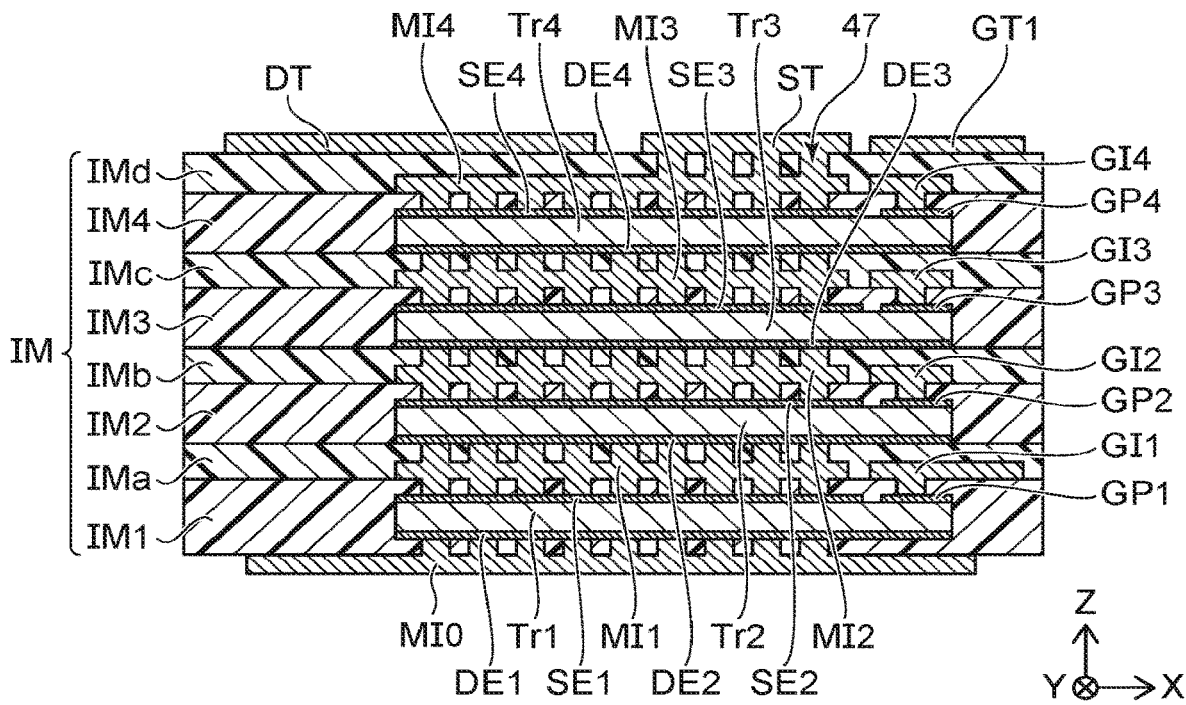
Figure 9A:
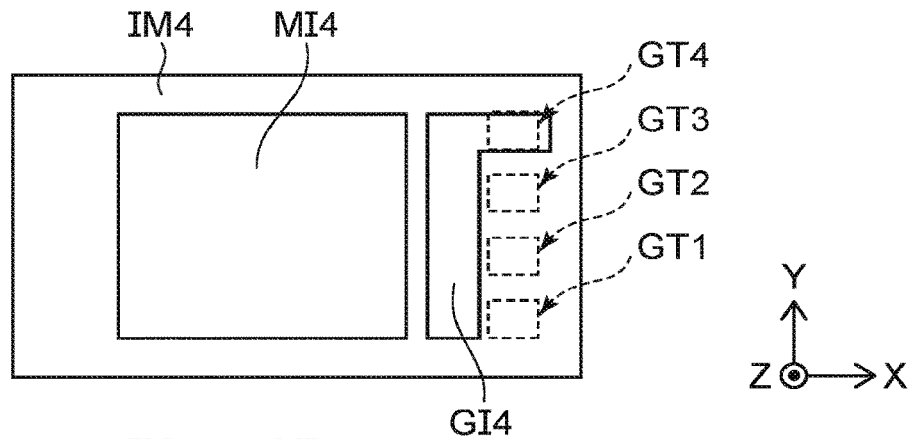
FIGS. 9A to 9D are schematic views showing interconnects of the semiconductor devices according to the first embodiment.
Figure 9B:
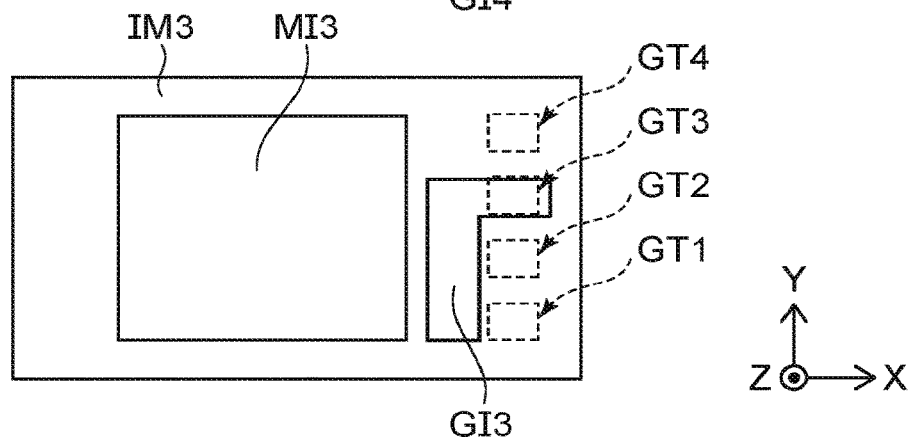
Figure 9C:
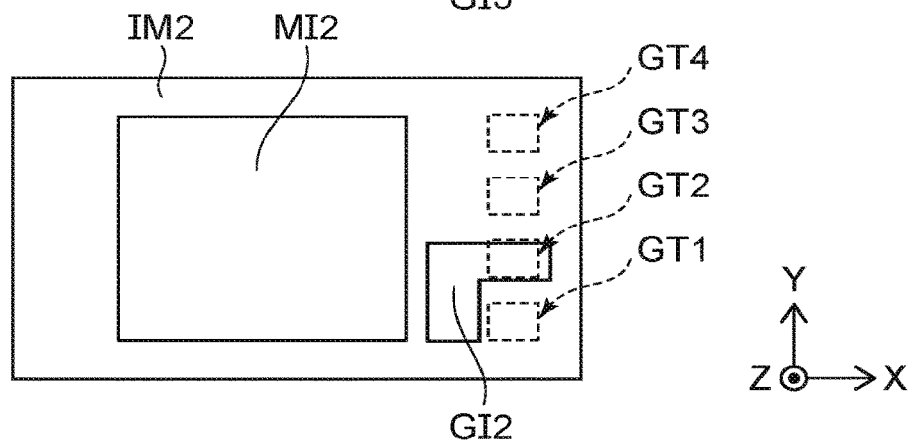
Figure 9D:
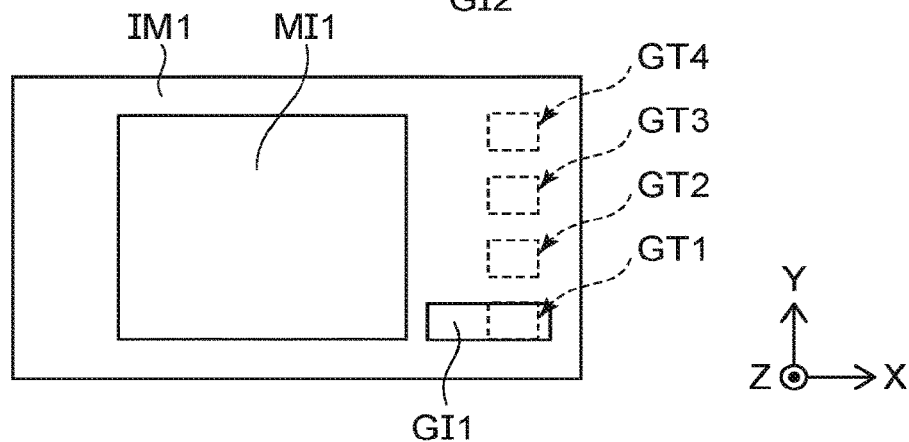

As shown in FIG. 8B, the first terminal DT, the second terminal ST, and the control terminals GT1 to GT4 (referring to FIG. 4B) are formed on the fourth insulating layer IMd.

For example, the first terminal DT, the second terminal ST, and the control terminals GT1 to GT4 are formed by patterning the copper foil on the fourth insulating layer IMd. The second terminal ST is electrically connected to the intermediate interconnect MI4 via a contact metal 47 that extends in the fourth insulating layer IMd.

The first terminal DT and the intermediate interconnect MI0 are electrically connected by the contact plug DP formed in the insulating member IM (referring to FIG. 4A). Also, the control interconnects GI1 to GI4 and the control terminals GT1 to GT4 are electrically connected respectively by the contact plugs GL1 to GL4 formed in the insulating member IM (referring to FIG. 3B). The insulating member IM is formed by, for example, curing the first to fourth insulating members IM1 to IM4 and the first to fourth insulating layers IMa to IMd. The first to fourth insulating members IM1 to IM4 and the first to fourth insulating layers IMa to IMd are joined together and form the insulating member IM with a continuous body.

FIGS. 9A to 9D are schematic views showing interconnects of the semiconductor devices 1 and 2 according to the first embodiment. FIGS. 9A to 9D are plan views illustrating the intermediate interconnects MI1 to MI4 and the control interconnects GI1 to GI4 that are provided on the first to fourth insulating members IM1 to IM4.

For example, the intermediate interconnects MI1 to MI4 match the size of the second electrode SE of the semiconductor element Tr (referring to FIG. 2B). The control interconnects GI1 to GI4 connect the control pads GP of the semiconductor elements Tr (referring to FIG. 2B) and the control terminals GT1 to GT4 when viewed in top-view.

Figure 10:
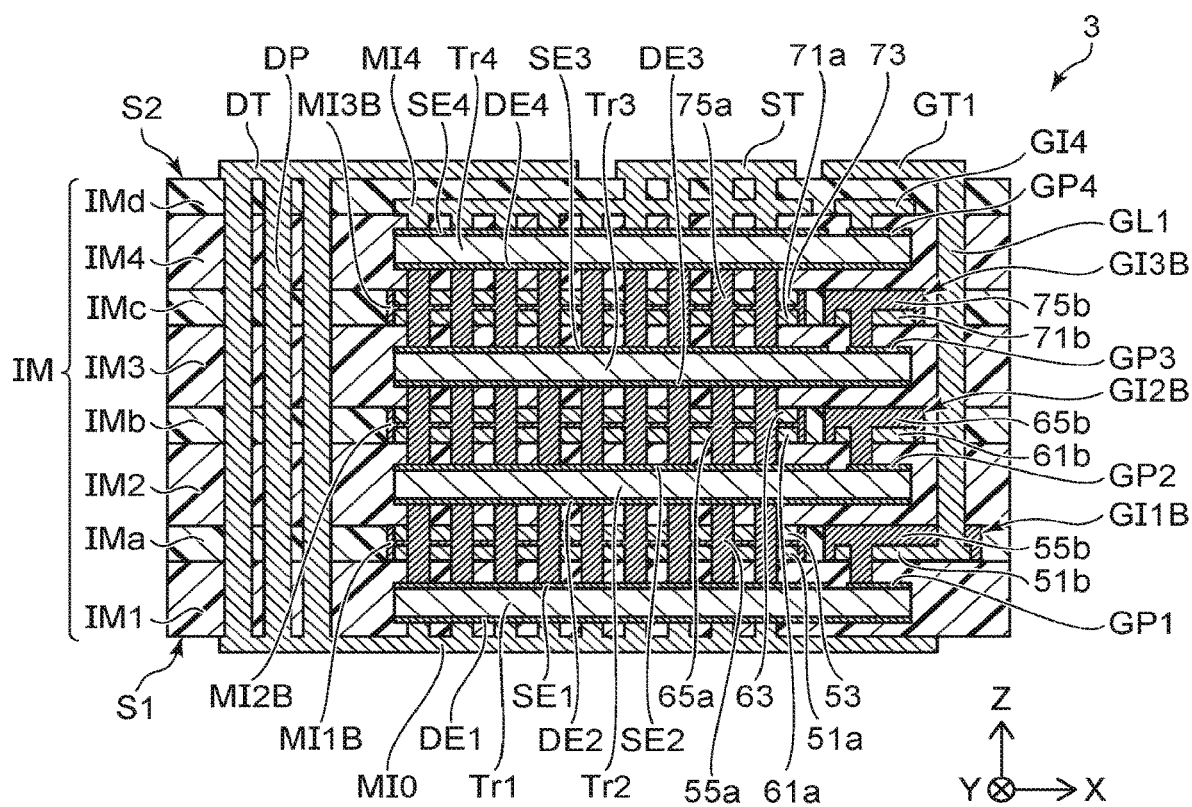
FIG. 10 is a schematic cross-sectional view showing a semiconductor device according to a second modification of the first embodiment.

FIG. 10 is a schematic cross-sectional view showing a semiconductor device 3 according to a second modification of the first embodiment. The semiconductor device 3 includes the semiconductor elements Tr1 to Tr4. The semiconductor elements Tr1 to Tr4 are connected in series. The semiconductor elements Tr1 to Tr4 are sealed inside the insulating member IM. The first terminal DT, the second terminal ST, and the control terminals GT1 to GT4 are provided on the second surface S2 of the insulating member IM.

The semiconductor element Tr1 is electrically connected to the semiconductor element Tr2 via the intermediate interconnect MI1. The control pad GP1 of the semiconductor element Tr1 is electrically connected to the control interconnect GI1. The intermediate interconnect MI1 and the control interconnect GI1 are provided in the first insulating layer IMa.

The intermediate interconnect MI1 includes metal layers 51a and 53 and a conductive member 55a. The metal layer 51a is provided on the front surface of the first insulating member IM1. The metal layer 53 is provided on the back surface of the second insulating member IM2. The metal layer 51a and the metal layer 53 are electrically connected via the conductive member 55a.

The conductive member 55a includes a portion that extends through the metal layer 51a and a portion of the first insulating member IM1 and contacts the second electrode SE1 of the semiconductor element Tr1. The intermediate interconnect MI1 is electrically connected to the second electrode SE1 of the semiconductor element Tr1 via the conductive member 55a.

Also, the conductive member 55a includes a portion that extends through the metal layer 53 and a portion of the second insulating member IM2 and contacts the first electrode DE2 of the semiconductor element Tr2. The intermediate interconnect MI1 is electrically connected to the first electrode DE2 of the semiconductor element Tr2 via the conductive member 55a.

The control interconnect GI1 includes a metal layer 51b and a conductive member 55b. The metal layer 51b is provided on the front surface of the first insulating member IM1. The conductive member 55b covers the metal layer 51b. The conductive member 55b includes a portion that extends through the metal layer 51b and another portion of the first insulating member IM1 and contacts the control pad GP1 of the semiconductor element Tr1. The control interconnect GI1 is electrically connected to the control pad GP1 of the semiconductor element Tr1 via the conductive member 55b.

The semiconductor element Tr2 is electrically connected to the semiconductor element Tr3 via the intermediate interconnect MI2. The control pad GP2 of the semiconductor element Tr2 is electrically connected to the control interconnect GI2. The intermediate interconnect MI2 and the control interconnect GI2 are provided in the second insulating layer IMb.

The intermediate interconnect MI2 includes metal layers 61a and 63 and a conductive member 65a. The metal layer 61a is provided on the front surface of the second insulating member IM2. The metal layer 63 is provided on the back surface of the third insulating member IM3. The metal layer 61a and the metal layer 63 are connected via the conductive member 65a.

The conductive member 65a includes a portion that extends through the metal layer 61a and a portion of the second insulating member IM2 and contacts the second electrode SE2 of the semiconductor element Tr2. The intermediate interconnect MI2 is electrically connected to the second electrode SE2 of the semiconductor element Tr2 via the conductive member 65a.

Also, the conductive member 65a includes a portion that extends through the metal layer 63 and a portion of the third insulating member IM3 and contacts the first electrode DE3 of the semiconductor element Tr3. The intermediate interconnect MI2 is electrically connected to the first electrode DE3 of the semiconductor element Tr3 via the conductive member 65a.

The control interconnect GI2 includes a metal layer 61b and a conductive member 65b. The metal layer 61b is provided on the front surface of the second insulating member IM2. The conductive member 65b covers the metal layer 61b. The conductive member 65b includes a portion that extends through the metal layer 61b and another portion of the second insulating member IM2 and contacts the control pad GP2 of the semiconductor element Tr2. The control interconnect GI2 is electrically connected to the control pad GP2 of the semiconductor element Tr2 via the conductive member 65b.

The semiconductor element Tr3 is electrically connected to the semiconductor element Tr4 via the intermediate interconnect MI3. The control pad GP3 of the semiconductor element Tr3 is electrically connected to the control interconnect GI3. The intermediate interconnect MI3 and the control interconnect GI3 are provided in the third insulating layer IMc.

The intermediate interconnect MI3 includes metal layers 71a and 73 and a conductive member 75a. The metal layer 71a is provided on the front surface of the third insulating member IM3. The metal layer 73 is provided on the back surface of the fourth insulating member IM4. The metal layer 71a and the metal layer 73 are connected via the conductive member 75a.

The conductive member 75a includes a portion that extends through the metal layer 71a and a portion of the third insulating member IM3 and contacts the second electrode SE3 of the semiconductor element Tr3. The intermediate interconnect MI3 is electrically connected to the second electrode SE3 of the semiconductor element Tr3 via the conductive member 75a.

Also, the conductive member 75a includes a portion that extends through the metal layer 73 and a portion of the fourth insulating member IM4 and contacts the first electrode DE4 of the semiconductor element Tr4. The intermediate interconnect MI3 is electrically connected to the first electrode DE4 of the semiconductor element Tr4 via the conductive member 75a.

The control interconnect GI3 includes a metal layer 71b and a conductive member 75b. The metal layer 71b is provided on the front surface of the third insulating member IM3. The conductive member 75b covers the metal layer 71b. The conductive member 75b includes a portion that extends through the metal layer 71b and another portion of the third insulating member IM3 and contacts the control pad GP3 of the semiconductor element Tr3. The control interconnect GI3 is electrically connected to the control pad GP3 of the semiconductor element Tr3 via the conductive member 75b.

The semiconductor device 3 further includes the intermediate interconnect MI0, the intermediate interconnect MI4, and the control interconnect GI4. The intermediate interconnect MI0 is electrically connected to the semiconductor element Tr1; and the intermediate interconnect MI4 is electrically connected to the semiconductor element Tr4. The control interconnect GI4 is electrically connected to the control pad GP4 of the semiconductor element Tr4.

The intermediate interconnect MI0 is provided on the first surface S1 of the insulating member IM. The intermediate interconnect MI0 is electrically connected to the first electrode DE1 of the semiconductor element Tr1 via the contact metal 31a (referring to FIG. 5F) that extends in the first insulating member IM1.

The intermediate interconnect MI4 and the control interconnect GI4 are provided on the front surface of the fourth insulating member IM4. The intermediate interconnect MI4 is electrically connected to the second electrode SE4 of the semiconductor element Tr4 via the contact metal 45a (referring to FIG. 8A) that extends in the fourth insulating member IM4. The control interconnect GI4 is electrically connected to the control pad GP4 of the semiconductor element Tr4 via the contact metal 45b (referring to FIG. 8A) that extends in the fourth insulating member IM4.

The first terminal DT is electrically connected to the semiconductor element Tr1 via the intermediate interconnect MI0 and the contact plug DP that extends in the insulating member IM.

The second terminal ST is electrically connected to the intermediate interconnect MI4 via the contact metal 47 that extends in the fourth insulating layer IMd covering the intermediate interconnect MI4.

The control terminals GT1 to GT4 (referring to FIG. 3B) are electrically connected to the control interconnects GI1 to GI4 via the contact plugs GL1 to GL4 that extend in the insulating member IM.

A method for manufacturing the semiconductor device 3 will now be described with reference to FIGS. 11A to 11D, FIGS. 12A to 12C, FIG. 13, and FIGS. 14A and 14B. FIGS. 11A to 11D, FIGS. 12A to 12C, FIG. 13, and FIGS. 14A and 14B are schematic cross-sectional views showing manufacturing processes of the semiconductor device 3.

Figure 11A:
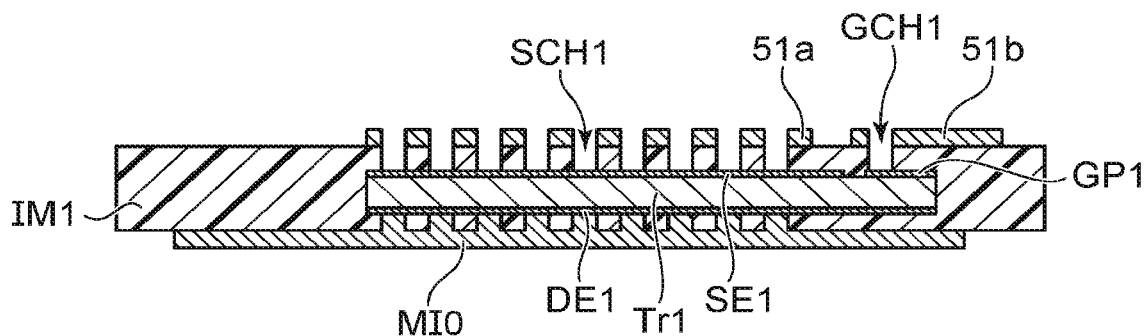
FIGS. 11A to 14B are schematic cross-sectional views showing manufacturing processes of the semiconductor device according to the second modification of the first embodiment.

As shown in FIG. 11A, the semiconductor element Tr1 is provided in the first insulating member IM1. The intermediate interconnect MI0 is formed on the back surface of the first insulating member IM1 (referring to FIGS. 5A to 5F). The metal layer 51a and the metal layer 51b are formed on the front surface of the first insulating member IM1. The metal layer 51a and the metal layer 51b are, for example, copper foils which are adhered to the first insulating member IM1 via a not-illustrated adhesive layer.

The contact holes SCH1 are formed at the front surface side of the the first insulating member IM1. The contact holes SCH1 communicate with the second electrode SE1 of the semiconductor element Tr1 from the front surface of the metal layer 51a. The contact hole GCH1 is formed at the front surface side of the the first insulating member IM1. The contact hole GCH1 communicates with the control pad GP1 of the semiconductor element Tr1 from the front surface of the metal layer 51b.

Figure 11B:
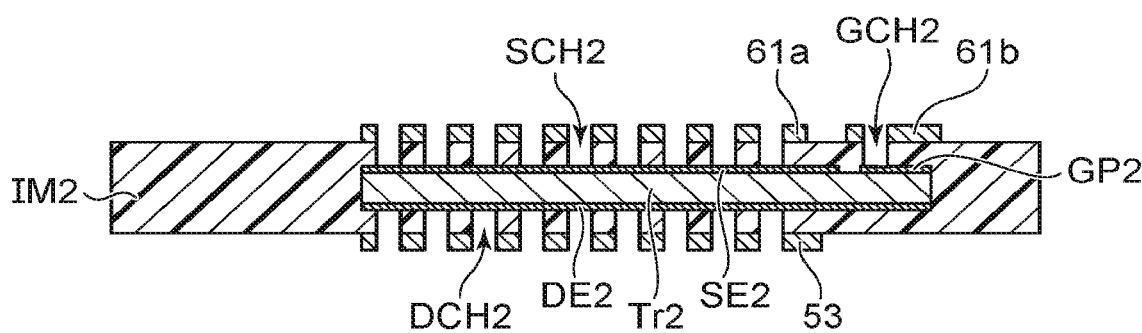

As shown in FIG. 11B, the semiconductor element Tr2 is provided in the second insulating member IM2. The metal layers 53, 61a, and 61b are formed on the back surface and front surface of the second insulating member IM2. The metal layer 53 is formed on the back surface of the second insulating member IM2. The metal layer 61a and the metal layer 61b are formed on the front surface of the second insulating member IM2. The metal layers 53, 61a, and 61b are, for example, copper foils which are adhered to the second insulating member IM2 via not-illustrated adhesive layers.

The contact holes DCH2 are formed at the back surface side of second insulating member IM2. The contact holes DCH2 communicate with the first electrode DE2 of the semiconductor element Tr2 from the back surface of the metal layer 53. The contact holes SCH2 are formed at the front surface side of second insulating member IM2. The contact holes SCH2 communicate with the second electrode SE2 of the semiconductor element Tr2 from the front surface of the metal layer 61a. The contact hole GCH2 is also formed at the front surface side of second insulating member IM2. The contact hole GCH2 communicates with the control pad GP2 of the semiconductor element Tr2 from the front surface of the metal layer 61b.

Figure 11C:
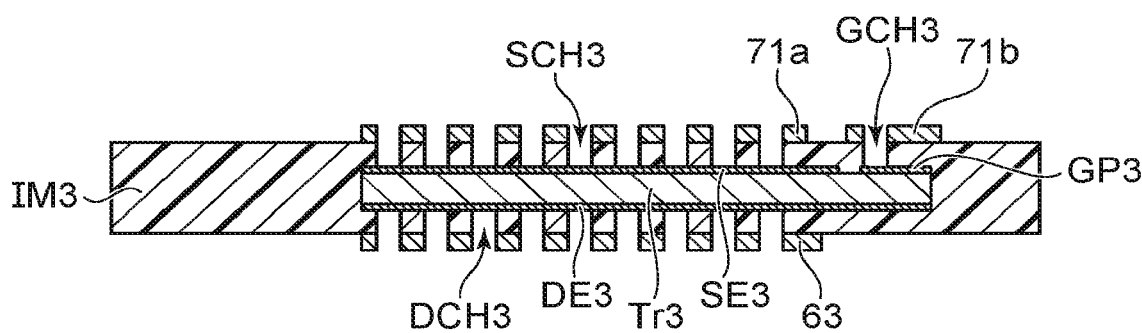

As shown in FIG. 11C, the semiconductor element Tr3 is provided in the third insulating member IM3. The metal layers 63, 71a, and 71b are formed on the back surface and front surface of the third insulating member IM3. The metal layer 63 is formed on the back surface of the third insulating member IM3. The metal layer 71a and the metal layer 71b are formed on the front surface of the third insulating member IM3. The metal layers 63, 71a, and 71b are, for example, copper foils which are adhered to the third insulating member IM3 via not-illustrated adhesive layers.

Contact holes DCH3 are formed at the back surface side of the third insulating member IM3. The contact holes DCH3 communicate with the first electrode DE3 of the semiconductor element Tr3 from the back surface of the metal layer 63. Contact holes SCH3 are formed at the front surface side of the third insulating member IM3. The contact holes SCH3 communicate with the second electrode SE3 of the semiconductor element Tr3 from the front surface of the metal layer 71a. A contact hole GCH3 is also formed at the front surface side of the third insulating member IM3. The contact hole GCH3 communicates with the control pad GP3 of the semiconductor element Tr3 from the front surface of the metal layer 71b.

Figure 11D:
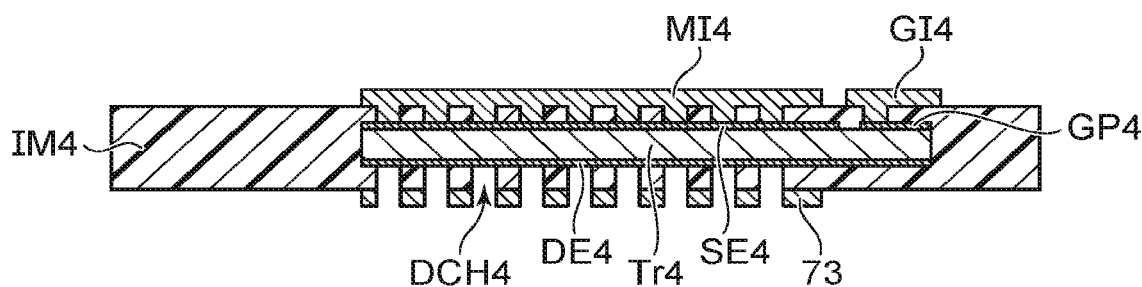

As shown in FIG. 11D, the semiconductor element Tr4 is provided inside the fourth insulating member IM4. The metal layer 73, the intermediate interconnect MI4, and the control interconnect GI4 are formed on the back surface and front surface of the fourth insulating member IM4. The metal layer 73 is formed on the back surface of the fourth insulating member IM4. The intermediate interconnect MI4 and the control interconnect GI4 are formed on the front surface of the third insulating member IM3 (referring to FIGS. 5D to 5F).

The metal layer 73 is, for example, a copper foil which is adhered to the fourth insulating member IM4 via a not-illustrated adhesive layer. Contact holes DCH4 are formed at the back surface side of the fourth insulating member IM4. The contact holes DCH4 communicate with the first electrode DE4 of the semiconductor element Tr4 from the back surface of the metal layer 73.

The intermediate interconnect MI4 is electrically connected to the second electrode SE4 of the semiconductor element Tr4 via, for example, the contact metal 45a (referring to FIG. 8A). The control interconnect GI4 is electrically connected to the control pad GP4 of the semiconductor element Tr4 via, for example, the contact metal 45b (referring to FIG. 8A).

Figure 12A:
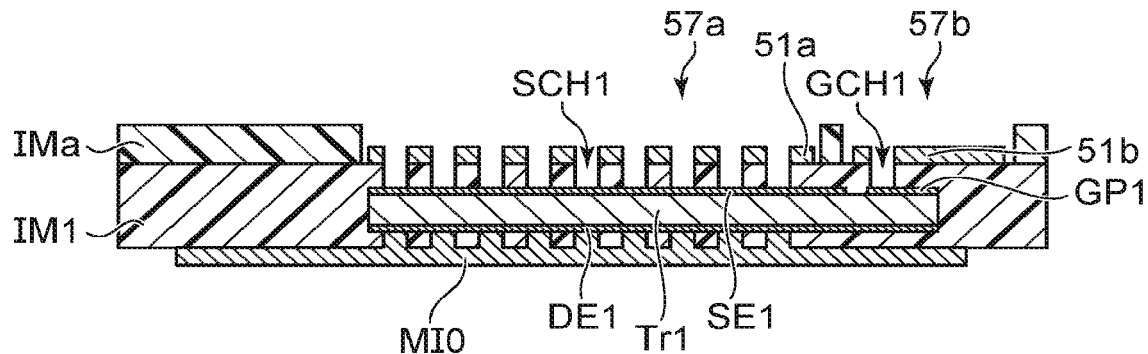

As shown in FIG. 12A, the first insulating layer IMa is formed on the front surface of the first insulating member IM1. The first insulating layer IMa is, for example, pre-preg and includes an opening 57a and an opening 57b. The metal layer 51a and the contact holes SCH1 are exposed in the opening 57a. The metal layer 51b and the contact hole GCH1 are exposed in the opening 57b.

Figure 12B:
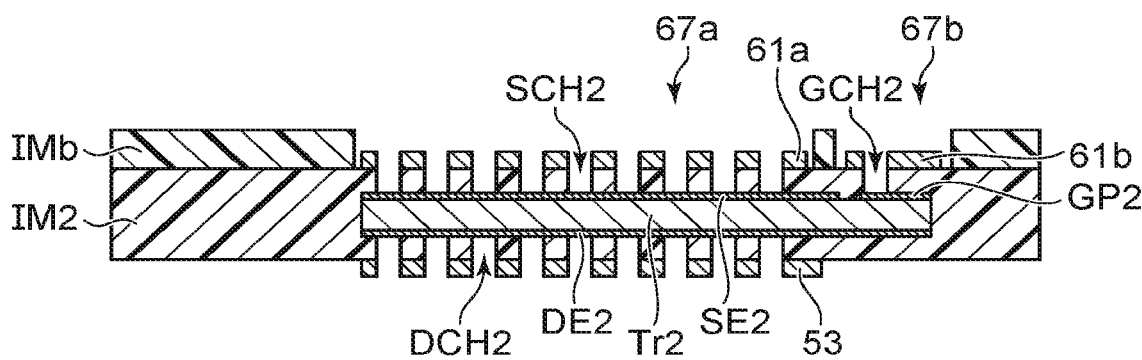

As shown in FIG. 12B, the second insulating layer IMb is formed on the front surface of the second insulating member IM2. The second insulating layer IMb is, for example, pre-preg and includes an opening 67a and an opening 67b. The metal layer 61a and the contact holes SCH2 are exposed in the opening 67a. The metal layer 61b and the contact hole GCH2 are exposed in the opening 67b.

Figure 12C:
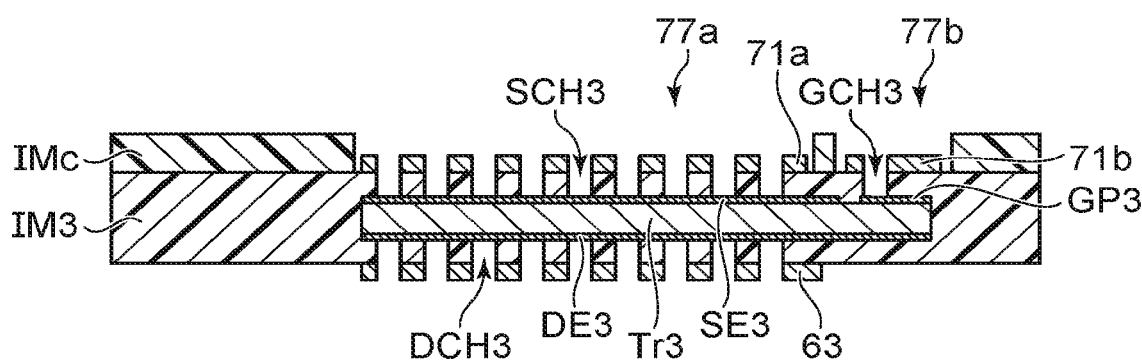

As shown in FIG. 12C, the third insulating layer IMc is formed on the front surface of the third insulating member IM3. The third insulating layer IMc is, for example, pre-preg and includes an opening 77a and an opening 77b. The metal layer 71a and the contact holes SCH3 are exposed in the opening 77a. The metal layer 71b and the contact hole GCH3 are exposed in the opening 77b.

Figure 13:
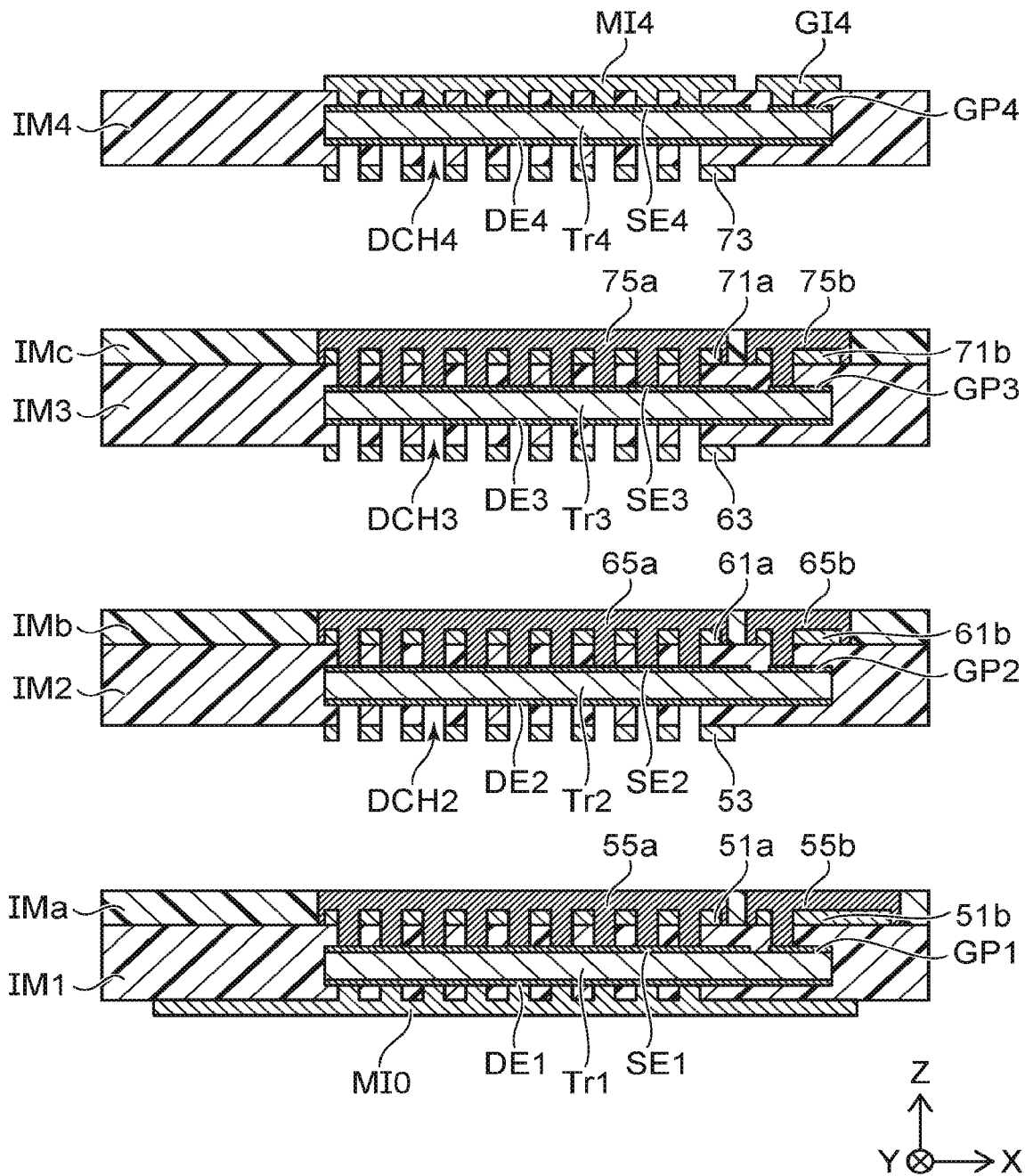

As shown in FIG. 13, the openings 57a and 57b of the first insulating layer IMa are filled with the conductive members 55a and 55b, respectively. Similarly, the openings 67a and 67b of the second insulating layer IMb are filled with the conductive members 65a and 65b, respectively; and the openings 77a and 77b of the third insulating layer IMc are filled with the conductive members 75a and 75b, respectively. The conductive members are, for example, conductive resins that include a conductive paste or metal particles.

The contact holes SCH1 is filled with the conductive member 55a. The conductive member 55a contacts the second electrode SE1 of the semiconductor element Tr1. The contact hole GCH1 is filled with the conductive member 55b. The conductive member 55b contacts the control pad GP1 of the semiconductor element Tr1 (referring to FIG. 12A).

The contact holes SCH2 is filled with the conductive member 65a. The conductive member 65a contacts the second electrode SE2 of the semiconductor element Tr2. The contact hole GCH2 is filled with the conductive member 65b. The conductive member 65b contacts the control pad GP2 of the semiconductor element Tr2 (referring to FIG. 12B).

The contact holes SCH3 is filled with the conductive member 75a. The conductive member 75a contacts the second electrode SE3 of the semiconductor element Tr3. The contact hole GCH3 is filled with the conductive member 75b. The conductive member 75b contacts the control pad GP3 of the semiconductor element Tr3 (referring to FIG. 12C).

The first to fourth insulating members IM1 to IM4 are arranged, for example, in the Z-direction. The first insulating layer IMa faces the back surface of the second insulating member IM2. The second insulating layer IMb faces the back surface of the third insulating member IM3. The third insulating layer IMc faces the back surface of the fourth insulating member IM4.

Figure 14A:
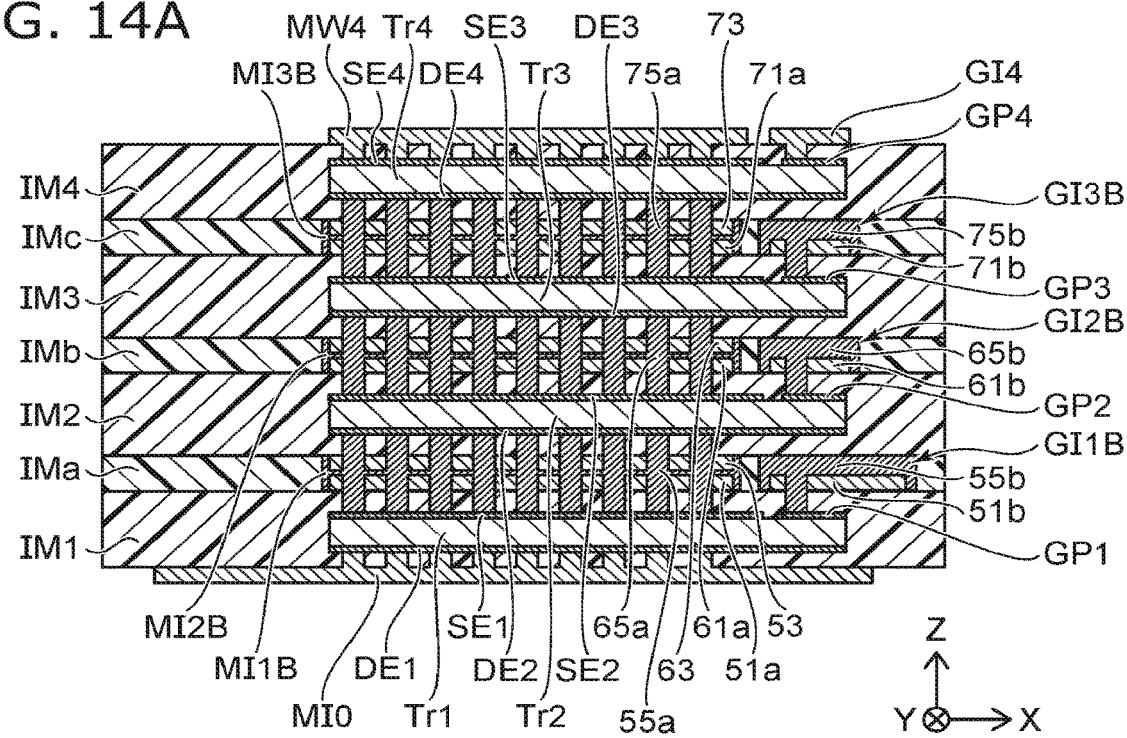

As shown in FIG. 14A, the first to fourth insulating members IM1 to IM4 are bonded with the first to third insulating layers IMa to IMc respectively interposed. The first to third insulating layers IMa to IMc include, for example, a thermosetting resin. The first to fourth insulating members IM1 to IM4 are bonded, for example, by pressing in the vertical direction and curing at a high temperature.

The intermediate interconnect MI1 and the control interconnect GI1 are formed between the first insulating member IM1 and the second insulating member IM2. The intermediate interconnect MI1 includes the metal layer 51a, the metal layer 53, and the conductive member 55a. The conductive member 55a extends into the contact holes DCH2 (referring to FIG. 13) and contacts the first electrode DE2 of the second semiconductor element Tr2. The control interconnect GI1 includes the metal layer 51b and the conductive member 55b.

The intermediate interconnect MI1 electrically connects the second electrode SE1 of the semiconductor element Tr1 and the first electrode DE2 of the semiconductor element Tr2 via the conductive member 55a. The control interconnect GI1 is electrically connected to the control pad GP1 of the semiconductor element Tr1 via the conductive member 55b.

The intermediate interconnect MI2 and the control interconnect GI2 are formed between the second insulating member IM2 and the third insulating member IM3. The intermediate interconnect MI2 includes the metal layer 61a, the metal layer 63, and the conductive member 65a. The conductive member 65a extends into the contact holes DCH3 (referring to FIG. 13) and contacts the first electrode DE3 of the third semiconductor element Tr3. The control interconnect GI2 includes the metal layer 61b and the conductive member 65b.

The intermediate interconnect MI2 electrically connects the second electrode SE2 of the semiconductor element Tr2 and the first electrode DE3 of the semiconductor element Tr3 via the conductive member 65a. The control interconnect GI2 is electrically connected to the control pad GP2 of the semiconductor element Tr2 via the conductive member 55b.

The intermediate interconnect MI3 and the control interconnect GI3 are formed between the third insulating member IM3 and the fourth insulating member IM4. The intermediate interconnect MI3 includes the metal layer 71a, the metal layer 73, and the conductive member 75a. The conductive member 75a extends into the contact holes DCH4 (referring to FIG. 13) and contacts the first electrode DE4 of the fourth semiconductor element Tr4. The control interconnect GI3 includes the metal layer 71b and the conductive member 75b.

The intermediate interconnect MI3 electrically connects the second electrode SE3 of the semiconductor element Tr3 and the first electrode DE4 of the semiconductor element Tr4 via the conductive member 75a. The control interconnect GI3 is electrically connected to the control pad GP3 of the semiconductor element Tr3 via the conductive member 75b.

Figure 14B:
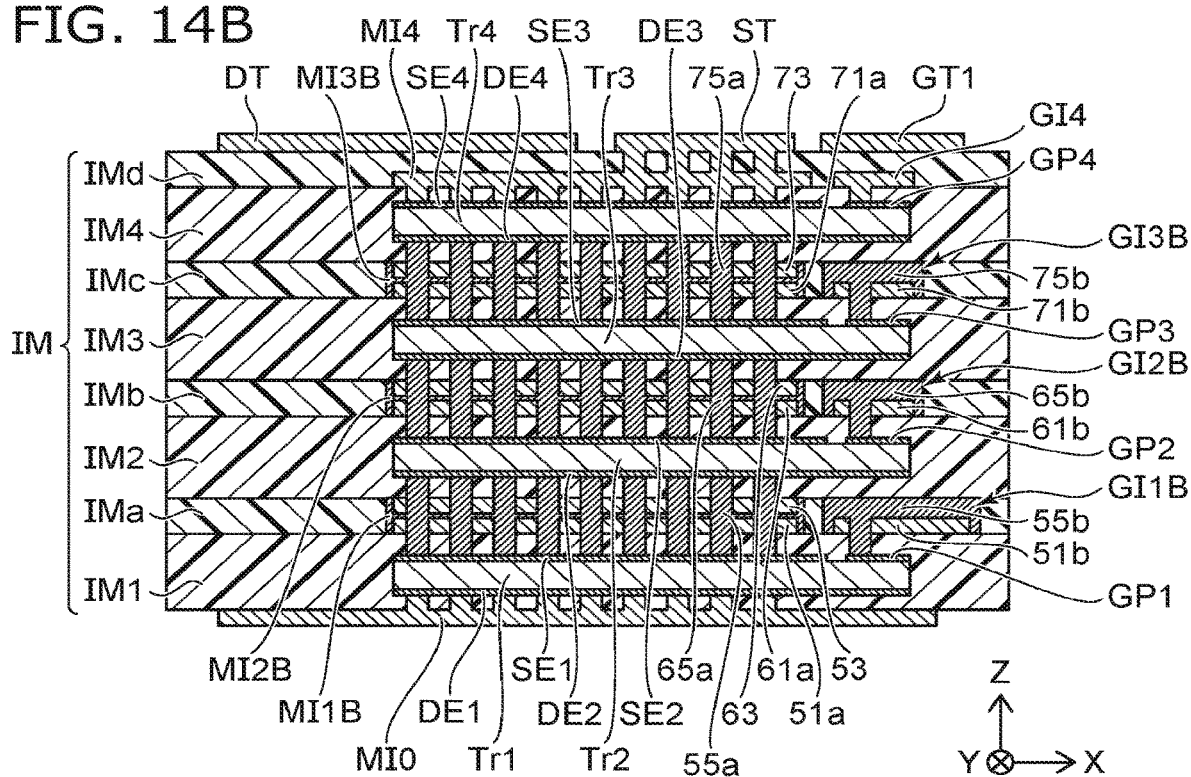

As shown in FIG. 14B, the fourth insulating layer IMd is formed on the front surface of the fourth insulating member IM4. Then, the first terminal DT, the second terminal ST, and the control terminals GT1 to GT4 (referring to FIG. 4B) are formed on the front surface of the fourth insulating layer IMd. The second terminal ST is electrically connected to the intermediate interconnect MI4 via the contact metal 47 (referring to FIG. 8B) that extends in the fourth insulating layer IMd.

The first terminal DT and the intermediate interconnect MI0 are electrically connected by the contact plug DP formed in the insulating member IM (referring to FIG. 4A). The control interconnects GI1 to GI4 and the control terminals GT1 to GT4 are electrically connected respectively by the contact plugs GL1 to GL4 formed in the insulating member IM (referring to FIG. 3B). The insulating member IM includes, for example, the first to fourth insulating members IM1 to IM4 and the first to fourth insulating layers IMa to IMd.

As shown in examples described above, the semiconductor elements Tr1 to Tr4 are arranged, for example, in the direction (the Z-direction) from the first surface S1 of the insulating member IM toward the second surface S2. The semiconductor elements Tr1 to Tr4 are connected in series. Thereby, the semiconductor devices 1 to 3 can be provided with a high breakdown voltage. The semiconductor devices 1 to 3 are mounted on the circuit board such that the first surface S1 faces the circuit board. Thereby, it is possible in the circuit board to reduce the mounting area of the semiconductor devices 1 to 3.

It is preferable for the semiconductor elements Tr1 to Tr4 to have substantially the same capacitance between the first electrode DE and the second electrode SE. The semiconductor elements Tr1 to Tr4 may be provided with the p-n junction between the first semiconductor layer 11 and the second semiconductor layer 13 (referring to FIG. 2A) having substantially the same surface area. Thereby, the voltage applied to the semiconductor devices 1 to 3 is divided evenly for the semiconductor elements Tr1 to Tr4 connected in series; and the breakdown voltage of the semiconductor devices 1 to 3 may be increased.

Second Embodiment

Figure 15A:
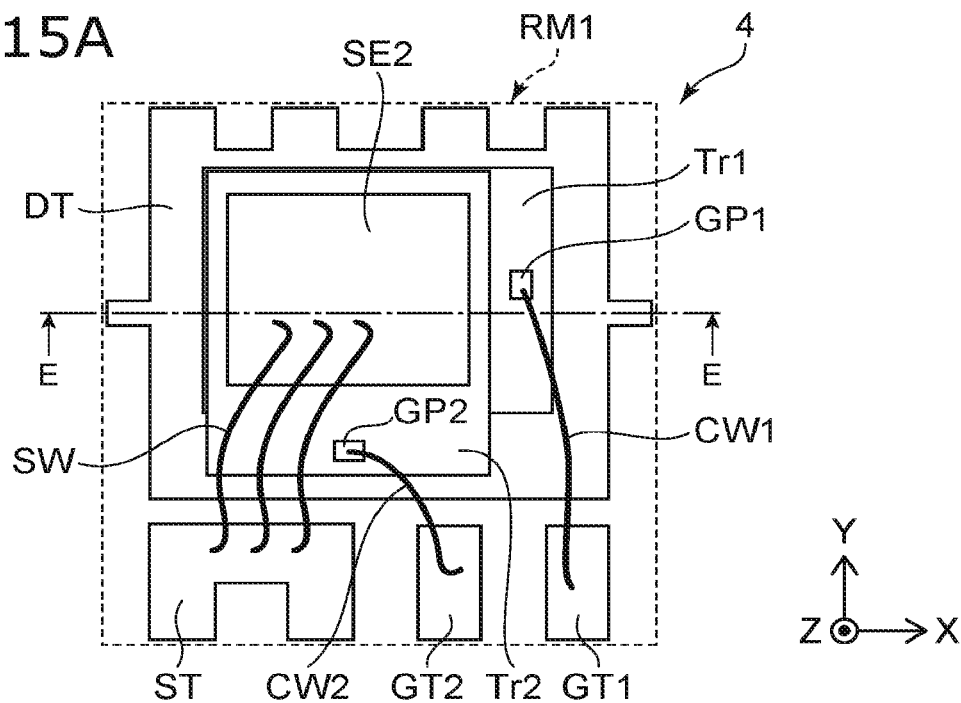
FIGS. 15A to 16B are schematic views showing a semiconductor device according to a second embodiment.
Figure 15B:
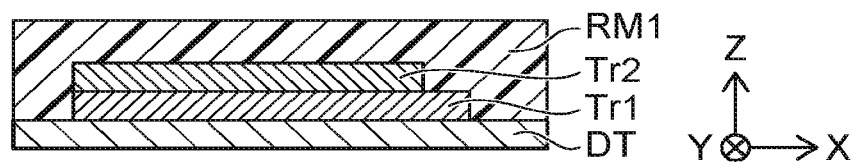
Figure 15C:
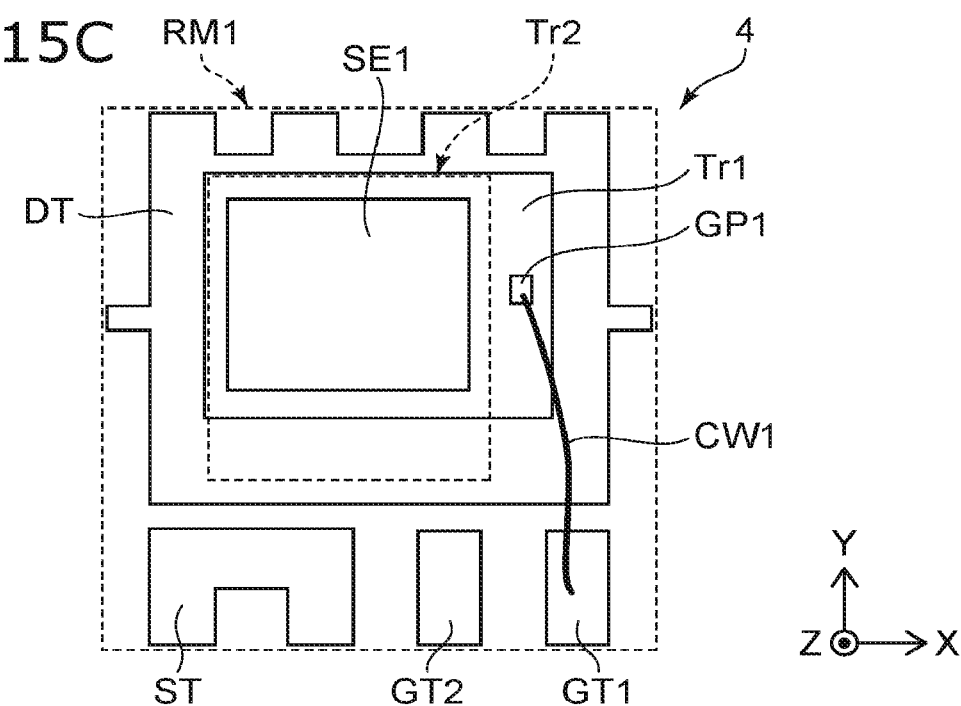
Figure 16A:
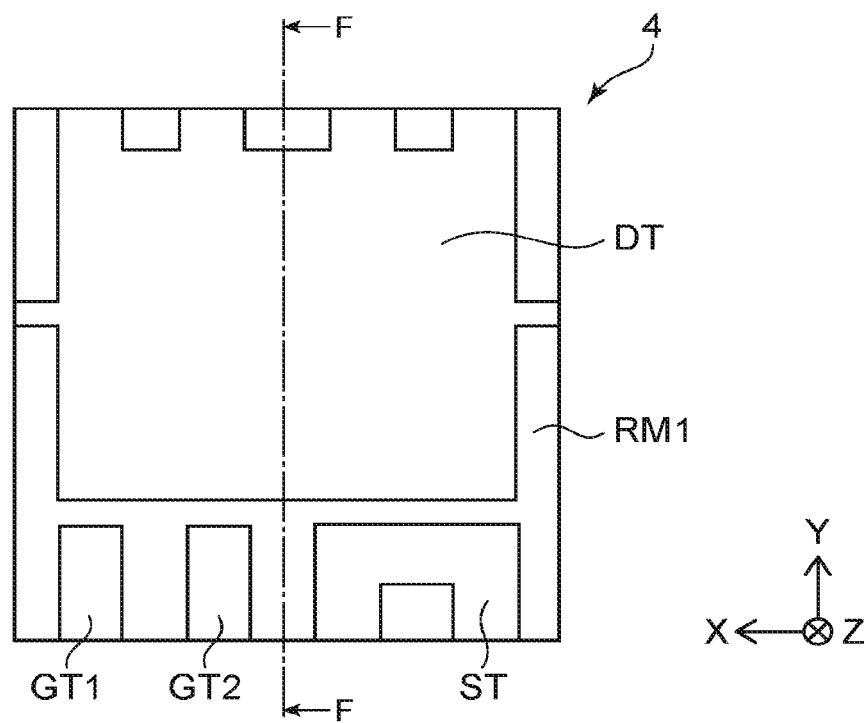
Figure 16B:
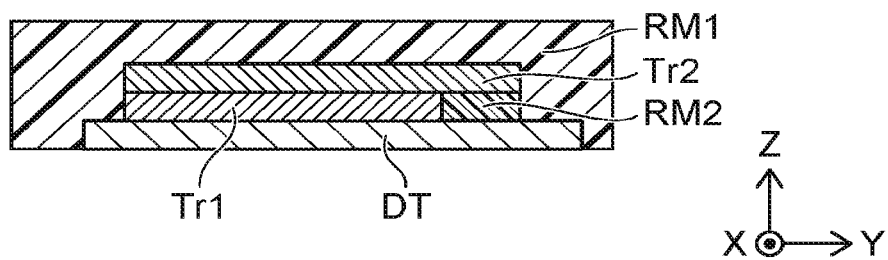

FIGS. 15A to 15C and FIGS. 16A and 16B are schematic views showing a semiconductor device 4 according to a second embodiment. FIGS. 15A and 15C are plan views showing the configuration of the semiconductor device 4. FIG. 16A is a plan view showing the back surface of the semiconductor device 4. FIG. 15B is a cross-sectional view along line E-E shown in FIG. 15A. FIG. 16B is a cross-sectional view along line F-F shown in FIG. 16A.

As shown in FIGS. 15A to 15C, the semiconductor device 4 includes the semiconductor elements Tr1 and Tr2, the first terminal DT, the second terminal ST, the control terminals GT1 and GT2, and an insulative resin member RM1. The first terminal DT, the second terminal ST, and the control terminals GT1 and GT2 are, for example, metal plates, i.e., so-called leads, that include copper.

The semiconductor elements Tr1 and Tr2 are stacked on the first terminal DT. The first terminal DT is electrically connected to the first electrode DE1 of the semiconductor element Tr1 (referring to FIG. 2A).

As shown in FIG. 15A, the second terminal ST is electrically connected to the second electrode SE2 of the semiconductor element Tr2 by, for example, a metal wire SW. The control terminal GT1 is electrically connected to the control pad GP1 of the semiconductor element Tr1 by, for example, a metal wire CW1. The control terminal GT2 is electrically connected to the control pad GP2 of the semiconductor element Tr2 by, for example, a metal wire CW2.

As shown in FIG. 15B, the semiconductor elements Tr1 and Tr2 are sealed on the first terminal DT by a resin member RM. The resin member RM is, for example, an epoxy resin. The semiconductor element Tr1 is bonded to the first terminal DT via a conductive bonding material (not illustrated) such as a solder material, etc. The semiconductor element Tr2 is connected to the semiconductor element Tr1 via another conductive bonding material (not illustrated).

As shown in FIG. 15C, the semiconductor element Tr2 is stacked on the second electrode SE1 of the semiconductor element Tr1. The first electrode DE2 of the semiconductor element Tr2 (referring to FIG. 2A) is electrically connected to the second electrode SE1 of the semiconductor element Tr1. In other words, the semiconductor elements Tr1 and Tr2 are connected in series.

The second electrode SE1 and the control pad GP1 of the semiconductor element Tr1 are arranged in an X-direction when stacked on the first terminal DT. On the other hand, the second electrode SE2 and the control pad GP2 of the semiconductor element Tr2 are arranged in a -Y-direction (the opposite direction of the Y-direction). Thus, by providing the semiconductor element Tr1 and the semiconductor element Tr2 in the directions orthogonal to each other, the semiconductor element Tr2 can be stacked without covering the control pad GP1 of the semiconductor element Tr1. Thereby, the control pad GP1 of the semiconductor element Tr1 and the control pad GP2 of the semiconductor element Tr2 can be electrically connected respectively to the control terminals GT1 and GT2 via the metal wires CW1 and CW2.

As shown in FIG. 16A, the semiconductor device 4 is configured so that the first terminal DT, the second terminal ST, and the control terminals GT1 and GT2 are exposed at the back surface. Thereby, the semiconductor elements Tr1 and Tr2 can be electrically connected to, for example, a circuit board via a solder material; and it is possible to reduce the mounting area of the semiconductor device 4 in the circuit board.

As shown in FIG. 16B, the space between the first terminal DT and the semiconductor element Tr2 is filled with a resin member RM2. The resin member RM2 is provided under the control pad GP2 before the metal wire CW2 is bonded to the control pad GP2 of the semiconductor element Tr2. Thereby, the strength of the semiconductor element Tr2 is increased at the portion where the control pad GP2 is provided, and the semiconductor element Tr2 can be prevented from the damage, cracks, and the like due to the load applied to the control pad GP2 while the metal wire CW2 is bonded thereon.

FIGS. 17A to 17C and FIG. 18 are schematic views showing a semiconductor device 5 according to a first modification of the second embodiment.

Figure 17A:
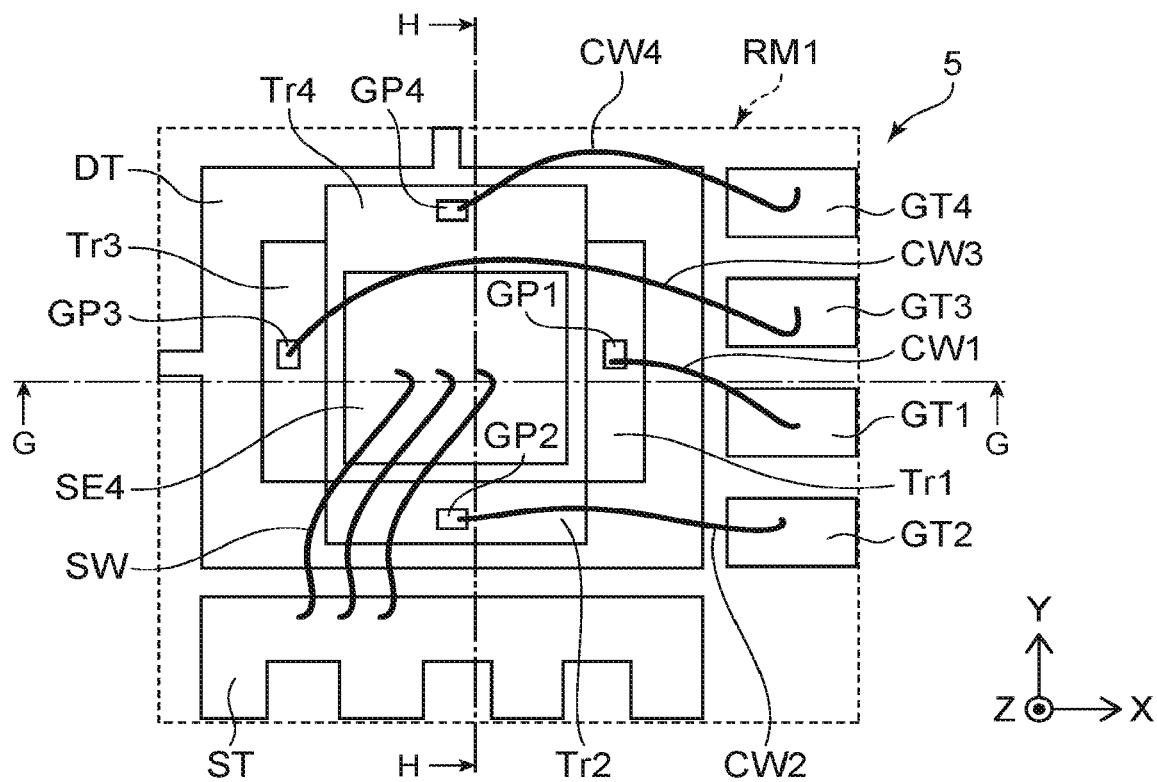
FIGS. 17A to 18 are schematic views showing a semiconductor device according to a first modification of the second embodiment.
Figure 17B:
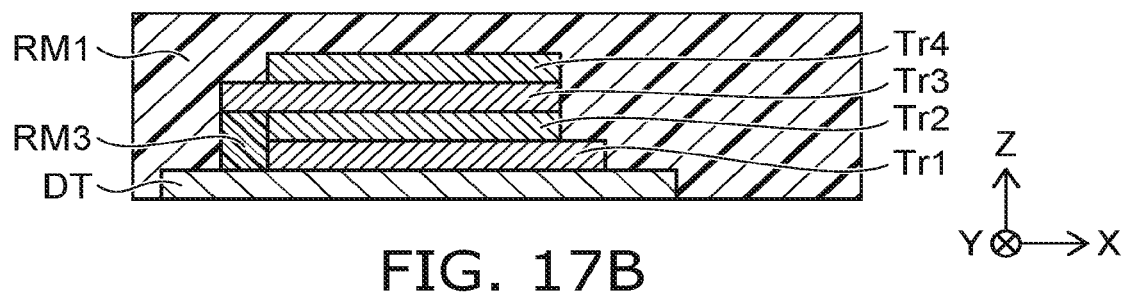
Figure 17C:
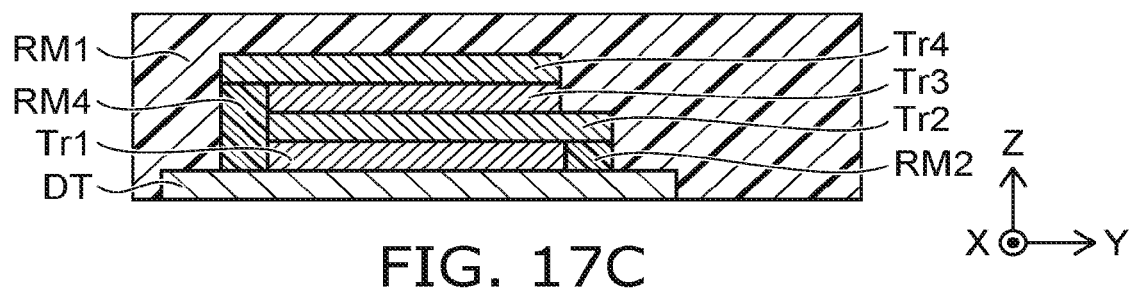

As shown in FIGS. 17A to 17C, the semiconductor device 5 includes the semiconductor elements Tr1 to Tr4, the first terminal DT, the second terminal ST, the control terminals GT1 to GT4, and the resin members RM1 to RM4. The semiconductor elements Tr1 to Tr4 are stacked in order on the first terminal DT. The first terminal DT is electrically connected to the first electrode DE1 of the semiconductor element Tr1 (referring to FIG. 2A).

As shown in FIG. 17A, the second terminal ST is electrically connected to the second electrode SE4 of the semiconductor element Tr4 by, for example, the metal wire SW. The control terminal GT1 is electrically connected to the control pad GP1 of the semiconductor element Tr1 by, for example, the metal wire CW1. The control terminal GT2 is electrically connected to the control pad GP2 of the semiconductor element Tr2 by, for example, the metal wire CW2. The control terminal GT3 is electrically connected to the control pad GP3 of the semiconductor element Tr3 by, for example, the metal wire CW3. The control terminal GT4 is electrically connected to the control pad GP4 of the semiconductor element Tr4 by, for example, the metal wire CW4.

The semiconductor element Tr2 is stacked on the second electrode SE1 of the semiconductor element Tr1 (referring to FIG. 15C). The first electrode DE2 of the semiconductor element Tr2 is electrically connected to the second electrode SE1 of the semiconductor element Tr1. In other words, the semiconductor elements Tr1 and Tr2 are connected in series. Similarly, the semiconductor elements Tr2 and Tr3 are connected in series by electrically connecting the first electrode DE3 of the semiconductor element Tr3 to the second electrode SE2 of the semiconductor element Tr2. The semiconductor elements Tr3 and Tr4 are connected in series by electrically connecting the first electrode DE4 of the semiconductor element Tr4 to the second electrode SE3 of the semiconductor element Tr3.

The second electrode SE1 and the control pad GP1 of the semiconductor element Tr1 are arranged in the X-direction when stacked on the first terminal DT (referring to FIG. 15C). The second electrode SE2 and the control pad GP2 of the semiconductor element Tr2 are arranged in the −Y-direction (referring to FIG. 15A). The second electrode SE3 and the control pad GP3 of the semiconductor element Tr3 are arranged in the −X-direction (the opposite direction of the X-direction). The second electrode SE4 and the control pad GP4 of the semiconductor element Tr4 are arranged in the Y-direction.

Thus, by providing the semiconductor element Tr1 to the semiconductor element Tr4 alternately in orthogonal directions, the semiconductor element Tr1 to the semiconductor element Tr4 are stacked without covering the control pads GP1 to GP4. Thereby, the metal wires CW1 to CW4 can be connected to the control pads GP1 to GP4, respectively.

As shown in FIG. 17B, the semiconductor elements Tr1 to Tr4 are sealed on the first terminal DT by the resin member RM. The semiconductor element Tr1 is bonded to the first terminal DT via, for example, a conductive bonding material (not illustrated). The semiconductor elements Tr1 to Tr4 each are electrically connected to the semiconductor element Tr adjacent thereto via other conductive bonding materials (not illustrated).

As shown in FIGS. 17B and 17C, the space between the first terminal DT and the semiconductor element Tr2 is filled with the resin member RM2. The resin member RM2 is provided under the control pad GP2 of the semiconductor element Tr2. Also, the resin members RM3 and RM4 may be provided in the spaces between the first terminal DT and the semiconductor elements Tr3 and Tr4. Thereby, the semiconductor elements Tr2 to Tr4 can be prevented from damage, cracks, and the like due to the load applied to the control pads GP2 to GP4 while the metal wires CW2 to CW4 are bonded thereon.

As shown in FIG. 18A, the semiconductor device 5 is configured so that the first terminal DT, the second terminal ST, and the control terminals GT1 to GT4 are exposed at the back surface. Thereby, the semiconductor elements Tr1 to Tr4 can be electrically connected to, for example, a circuit board via a solder material; and the mounting area of the semiconductor device 5 can be reduced in the circuit board.

Figure 19A:
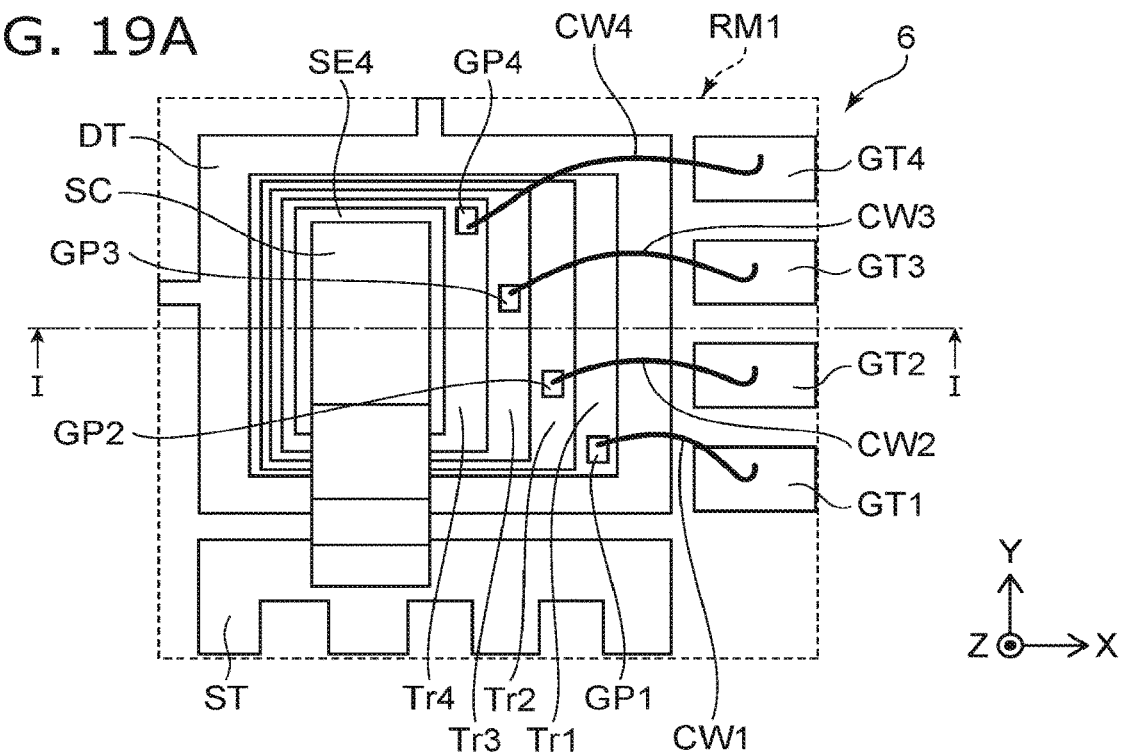
FIGS. 19A to 19C are schematic views showing a semiconductor device according to a second modification of the second embodiment.
Figure 19B:
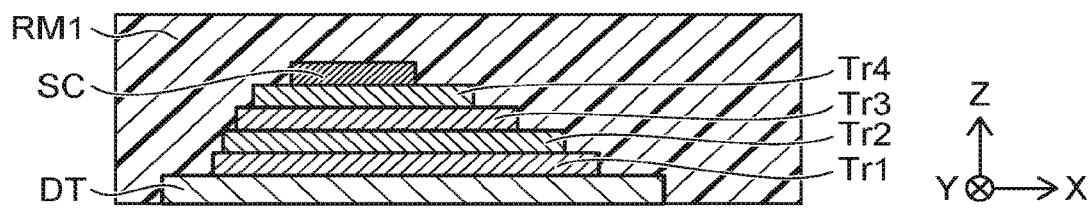
Figure 19C:
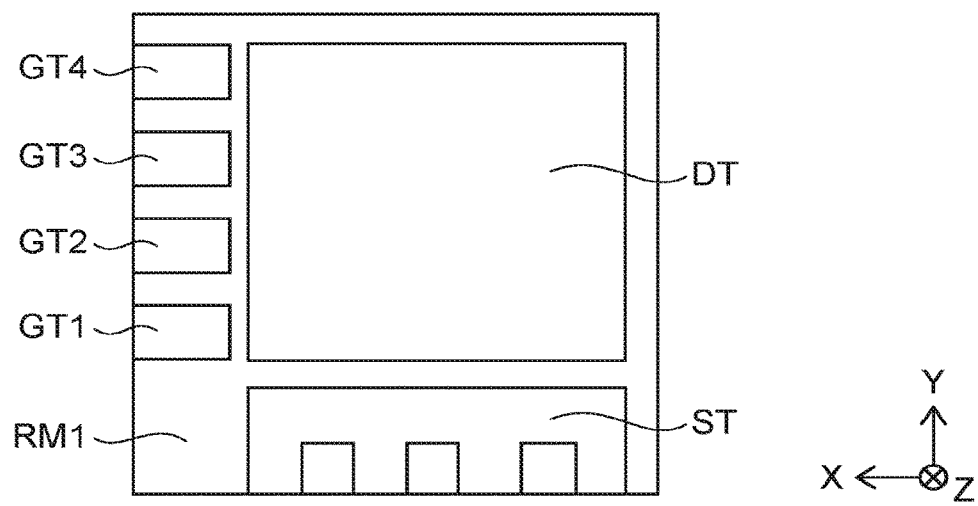

FIGS. 19A to 19C are schematic views showing a semiconductor device 6 according to a second modification of the second embodiment.

As shown in FIGS. 19A and 19B, the semiconductor device 6 includes the semiconductor elements Tr1 to Tr4, the first terminal DT, the second terminal ST, the control terminals GT1 to GT4, and the resin member RM1. The semiconductor elements Tr1 to Tr4 are stacked in order on the first terminal DT. The first terminal DT is electrically connected to the first electrode DE1 of the semiconductor element Tr1 (referring to FIG. 2A).

As shown in FIG. 19A, the second terminal ST is electrically connected to the second electrode SE4 of the semiconductor element Tr4 by, for example, a metal connector SC. The metal connector SC is, for example, a metal plate that includes copper. The metal connector SC is bonded to the second electrode SE4 and the second terminal ST via conductive bonding members.

The control terminal GT1 is electrically connected to the control pad GP1 of the semiconductor element Tr1 by, for example, the metal wire CW1. The control terminal GT2 is electrically connected to the control pad GP2 of the semiconductor element Tr2 by, for example, the metal wire CW2. The control terminal GT3 is electrically connected to the control pad GP3 of the semiconductor element Tr3 by, for example, the metal wire CW3. The control terminal GT4 is electrically connected to the control pad GP4 of the semiconductor element Tr4 by, for example, the metal wire CW4.

The semiconductor element Tr2 is stacked on the second electrode SE1 of the semiconductor element Tr1. The semiconductor elements Tr1 and Tr2 are connected in series by electrically connecting the first electrode DE2 of the semiconductor element Tr2 to the second electrode SE1 of the semiconductor element Tr1. Similarly, the semiconductor elements Tr2 and Tr3 are connected in series by electrically connecting the first electrode DE3 of the semiconductor element Tr3 to the second electrode SE2 of the semiconductor element Tr2. The semiconductor elements Tr3 and Tr4 are connected in series by electrically connecting the first electrode DE4 of the semiconductor element Tr4 to the second electrode SE3 of the semiconductor element Tr3.

The chip size of the semiconductor element Tr2 is smaller than the chip size of the semiconductor element Tr1; and the semiconductor element Tr2 is stacked on the semiconductor element Tr1 so that the control pad GP1 of the semiconductor element Tr1 is exposed. Similarly, the chip size of the semiconductor element Tr3 is smaller than the chip size of the semiconductor element Tr2; and the semiconductor element Tr3 is stacked on the semiconductor element Tr2 so that the control pad GP2 of the semiconductor element Tr2 is exposed. The chip size of the semiconductor element Tr4 is smaller than the chip size of the semiconductor element Tr3; and the semiconductor element Tr4 is stacked on the semiconductor element Tr3 so that the control pad GP3 of the semiconductor element Tr3 is exposed.

As shown in FIG. 19B, the semiconductor elements Tr1 to Tr4 are sealed on the first terminal DT by the resin member RM. The semiconductor element Tr1 is bonded to the first terminal DT by, for example, a conductive bonding material (not illustrated). The semiconductor elements Tr1 to Tr4 each are electrically connected to the semiconductor element Tr adjacent thereto via other conductive bonding material (not illustrated).

As shown in FIG. 19C, the semiconductor device 6 is configured so that the first terminal DT, the second terminal ST, and the control terminals GT1 to GT4 are exposed at the back surface. Thereby, the semiconductor elements Tr1 to Tr4 can be electrically connected to a circuit board via, for example, a solder material; and the mounting area of the semiconductor device 6 can be reduced in the circuit board.

Figure 20A:
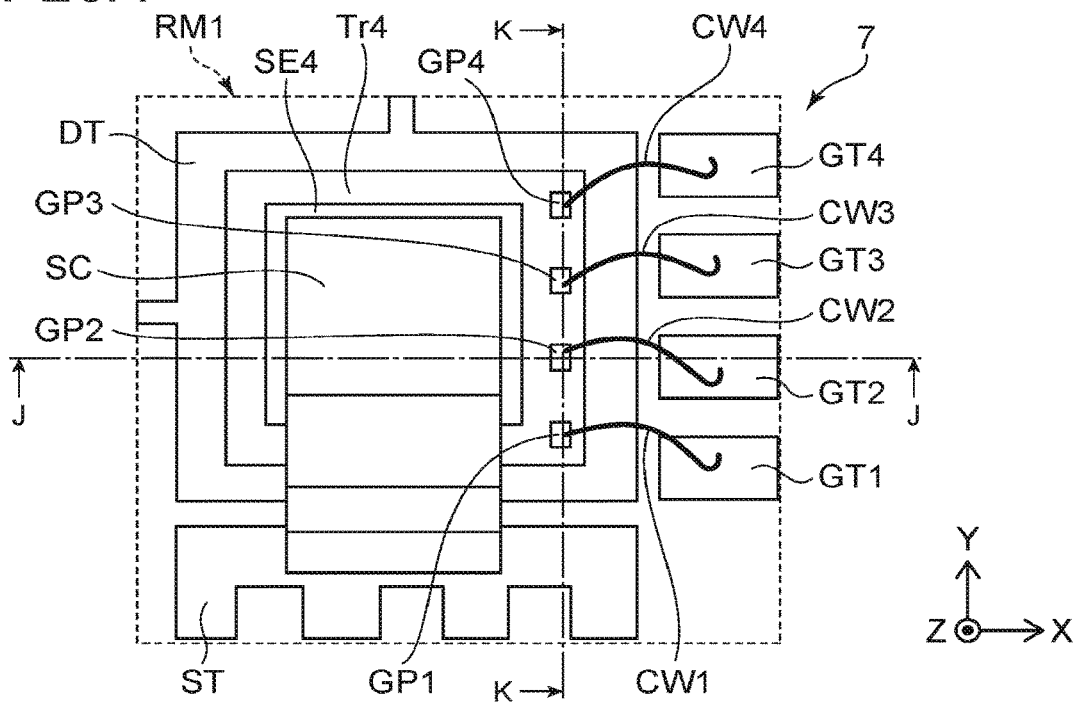
FIGS. 20A to 20C are schematic views showing a semiconductor device according to a third modification of the second embodiment.
Figure 20B:
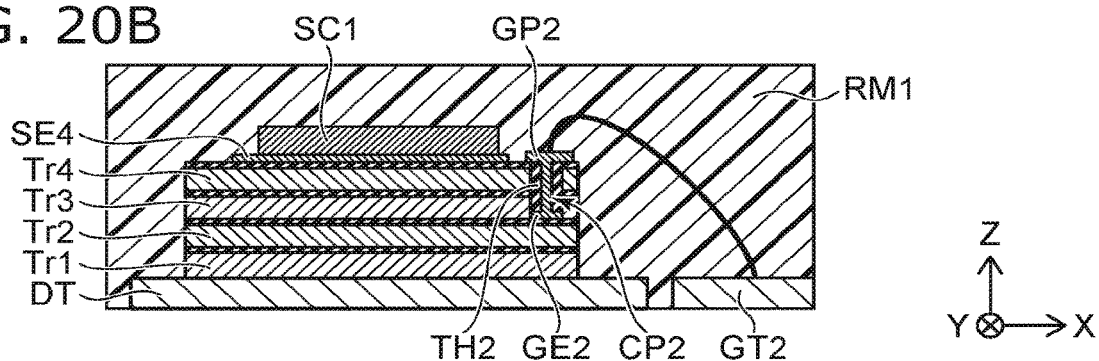
Figure 20C:
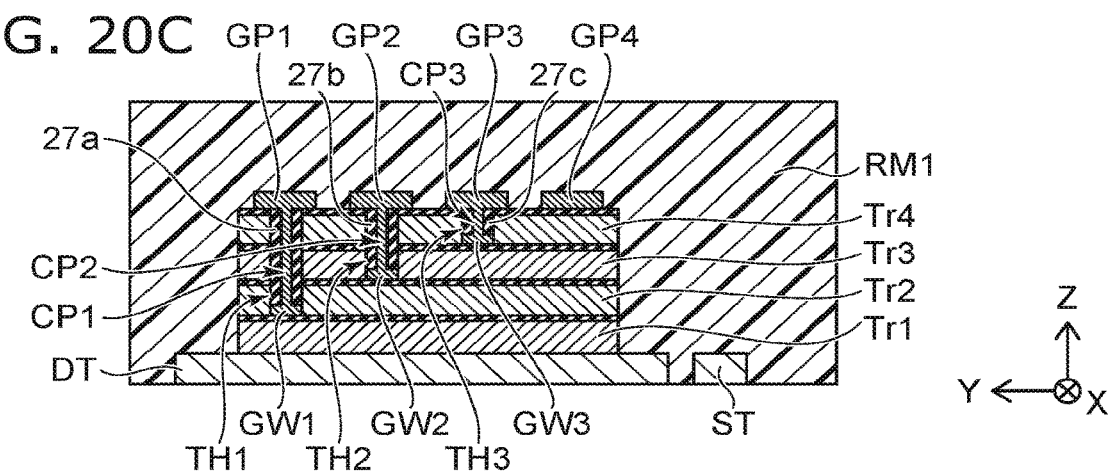

FIGS. 20A to 20C are schematic views showing a semiconductor device 7 according to a third modification of the second embodiment.

As shown in FIGS. 20A to 20C, the semiconductor device 7 includes the semiconductor elements Tr1 to Tr4, the first terminal DT, the second terminal ST, the control terminals GT1 to GT4, and the resin member RM1. The semiconductor elements Tr1 to Tr4 are stacked in order on the first terminal DT. The first terminal DT is electrically connected to the first electrode DE1 of the semiconductor element Tr1 (referring to FIG. 2A).

As shown in FIG. 20A, the second terminal ST is electrically connected to the second electrode SE4 of the semiconductor element Tr4 by, for example, the metal connector SC. The control terminal GT1 is electrically connected to the control pad GP1 by, for example, the metal wire CW1. The control terminal GT2 is electrically connected to the control pad GP2 by, for example, the metal wire CW2. The control terminal GT3 is electrically connected to the control pad GP3 by, for example, the metal wire CW3. The control terminal GT4 is electrically connected to the control pad GP4 by, for example, the metal wire CW4. In the example, the control pads GP1 to GP3 are provided on the front surface of the semiconductor element Tr4.

As shown in FIG. 20B, the semiconductor elements Tr1 to Tr4 are sealed on the first terminal DT by the resin member RM1. The semiconductor element Tr1 is bonded to the first terminal DT by, for example, a conductive bonding material (not illustrated). The semiconductor elements Tr1 to Tr4 each are electrically connected to the semiconductor element Tr adjacent thereto via other conductive bonding material (not illustrated).

The semiconductor elements Tr1 and Tr2 are connected in series by electrically connecting the first electrode DE2 of the semiconductor element Tr2 to the second electrode SE1 of the semiconductor element Tr1. Similarly, the semiconductor elements Tr2 and Tr3 are connected in series by electrically connecting the first electrode DE3 of the semiconductor element Tr3 to the second electrode SE2 of the semiconductor element Tr2. The semiconductor elements Tr3 and Tr4 are connected in series by electrically connecting the first electrode DE4 of the semiconductor element Tr4 to the second electrode SE3 of the semiconductor element Tr3.

As shown in FIG. 20C, the control pad GP1 is electrically connected to a control interconnect GW1 of the semiconductor element Tr1 via a contact plug CP1. The contact plug CP1 extends to the control interconnect GW1 of the semiconductor element Tr1 from the front surface of the semiconductor element Tr4. The contact plug CP1 is electrically insulated from the semiconductor elements Tr2 to Tr4 by an insulating film 27a.

The control pad GP2 is electrically connected to a control interconnect GW2 of the semiconductor element Tr2 via a contact plug CP2. The contact plug CP2 extends to the control interconnect GW2 of the semiconductor element Tr2 from the front surface of the semiconductor element Tr4. The contact plug CP2 is electrically insulated from the semiconductor elements Tr3 and Tr4 by an insulating film 27b.

The control pad GP3 is electrically connected to a control interconnect GW3 of the semiconductor element Tr3 via a contact plug CP3. The contact plug CP3 extends to the control interconnect GW3 of the semiconductor element Tr3 from the front surface of the semiconductor element Tr4. The contact plug CP3 is electrically insulated from the semiconductor element Tr4 by an insulating film 27c.

Figure 18:
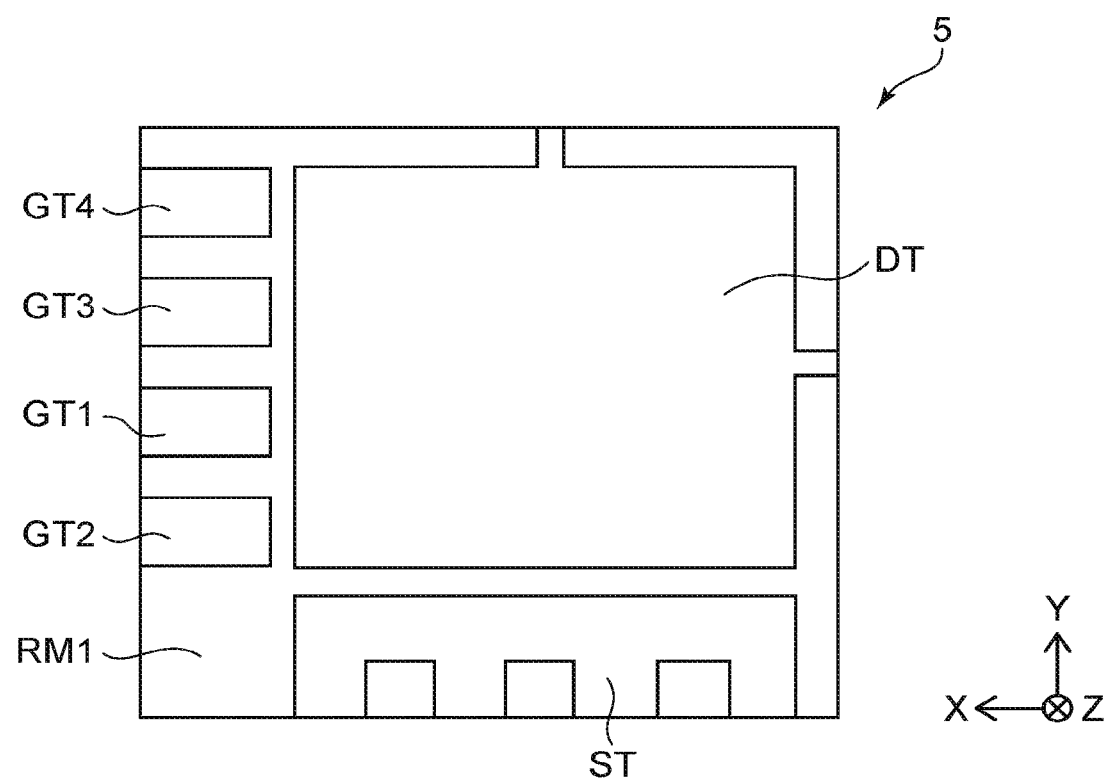

The semiconductor device 7 also is configured so that the first terminal DT, the second terminal ST, and the control terminals GT1 to GT4 are exposed at the back surface of the semiconductor device 7 (referring to FIG. 18). Thereby, the semiconductor elements Tr1 to Tr4 can be electrically connected to the circuit board via, for example, a solder material; and the mounting area of the semiconductor device 7 can be reduced in the circuit board.

According to the embodiment as well, it is preferable for the semiconductor elements Tr1 to Tr4 to have substantially the same capacitance between the first electrode DE and the second electrode SE. Thereby, a voltage applied to the semiconductor devices 1 to 3 is divided evenly for the semiconductor elements Tr1 to Tr4 connected in series; and the breakdown voltages may be increased in the semiconductor devices 1 to 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a plurality of semiconductor elements each including a semiconductor part, first and second electrodes, and a control electrode, each semiconductor part having a front surface and a back surface opposite to the front surface, each first electrode being provided on the back surface of the respective semiconductor part, each second electrode being provided on the front surface of the respective semiconductor part, each control electrode being provided on the front surface of the respective semiconductor part, each control electrode controlling a current that flows between the respective first electrode and the respective second electrode,
the plurality of semiconductor elements being arranged in a first direction directed from the respective first electrode toward the respective second electrode, the plurality of semiconductor elements being connected in series, the plurality of semiconductor elements including a first semiconductor element, a second semiconductor element, a first-end semiconductor element and a second-end semiconductor element, the second semiconductor element being provided next to the first semiconductor element, the first electrode of the second semiconductor element being electrically connected to the second electrode of the first semiconductor element, the first-end semiconductor element being provided at one end of the series connection, the second-end semiconductor element being provided at another end of the series connection;

an insulating member sealing the plurality of semiconductor elements, the insulating member including a first surface and a second surface opposite to the first surface, the first and second surfaces crossing the first direction, the first surface facing the first-end semiconductor element, the second surface facing the second-end semiconductor element;

a first terminal electrically connected to the first electrode of the first-end semiconductor element;

a second terminal provided at one of the first surface side or the second surface side of the insulating member, the second terminal being electrically connected to the second electrode of the second-end semiconductor element; and a plurality of control terminals electrically connected to the respective control electrodes of each of the plurality of semiconductor elements, the plurality of control terminals being provided at the one of the first surface side or the second surface side of the insulating member, the plurality of control terminals being apart from each other and apart from the second terminal.

2. The device according to claim 1, wherein
the first terminal is provided at the first surface side of the insulating member, and
the second terminal and the plurality of control terminals are provided at the second surface side of the insulating member.

3. The device according to claim 1, wherein
the first terminal, the second terminal, and the plurality of control terminals are provided at the second-surface side of the insulating member, and
the first terminal is apart from the second terminal and the plurality of control terminals.

4. The device according to claim 1, further comprising:
first conductive members provided in the insulating member,
the first conductive members electrically connecting the plurality of control terminals and the control electrodes of the plurality of semiconductor elements, respectively.

5. The device according to claim 3, further comprising:
a second conductive member provided in the insulating member,
the second conductive member electrically connecting the second terminal and the first electrode of the first-end semiconductor element.

6. The device according to claim 1, further comprising:
a plurality of interconnects electrically connecting the plurality of semiconductor elements, the plurality of interconnects each being provided between adjacent semiconductor elements of the plurality of semiconductor elements, one of the interconnects electrically connecting the second electrode of the first semiconductor element and the first electrode of the second semiconductor element,
the insulating member including first members and second members, the first and second members being alternately stacked in the first direction, the first members including the plurality of semiconductor elements, respectively, the second members including the plurality of interconnects, respectively.

7. The device according to claim 6, wherein
the first members of the insulating member each includes a plurality of contact holes communicating with the second electrode;
the plurality of interconnects each include a plurality of contact portions and a metal layer, the plurality of contact portions extending through the plurality of contact holes, respectively, the metal layer being provided on each of the first members, the plurality of contact portions being linked to the metal layer; and
the plurality of interconnects each are electrically connected to the second electrode via the plurality of contact portions.

8. The device according to claim 1, wherein
the first terminal, the second terminal, and the plurality of control terminals are provided at the first surface side of the insulating member, and
the first terminal is apart from the second terminal and the plurality of control terminals.

9. The device according to claim 8, wherein
the plurality of semiconductor elements is stacked in the first direction, and
the insulating member covers the plurality of semiconductor elements.

10. The device according to claim 7, wherein
one of the semiconductor elements includes a second electrode and a control electrode arranged in a second direction, the second direction being directed along the front surface of the semiconductor part;
another semiconductor element of the semiconductor elements is provided on the one of the semiconductor elements, a respective second electrode and control electrode of the another semiconductor element arranged in a third direction, the third direction being directed along the front surface of the semiconductor part and orthogonal to the second direction.

11. The device according to claim 10, wherein
the plurality of semiconductor elements each include a first width in the second direction and a second width in the third direction, and
the first width is less than the second width.

12. The device according to claim 10, wherein
the control electrodes of the plurality of semiconductor elements are electrically connected to the plurality of control terminals via a plurality of metal wires, respectively, in a one-to-one correspondence.

13. The device according to claim 9, wherein
one of the semiconductor elements has a larger chip size than a chip size of another semiconductor element stacked on the one of the semiconductor elements.

14. The device according to claim 8, wherein
the first terminal, the second terminal, and the plurality of control terminals each include a back surface and a respective front surface, each back surface being exposed at the first surface of the insulating member, the respective front surfaces being covered with the insulating member.

15. The device according to claim 1, wherein
the plurality of semiconductor elements each have a capacitance between the first electrode and the second electrode, the capacitance of the plurality of semiconductor elements being substantially the same.

* * * * *